(12) United States Patent
Yu et al.

(10) Patent No.: US 11,482,594 B2
(45) Date of Patent: Oct. 25, 2022

(54) SEMICONDUCTOR DEVICES WITH BACKSIDE POWER RAIL AND METHOD THEREOF

(71) Applicant: Taiwan Semiconductor Manufacturing Co., Ltd., Hsinchu (TW)

(72) Inventors: Li-Zhen Yu, Hsinchu (TW); Huan-Chieh Su, Changhua County (TW); Lin-Yu Huang, Hsinchu (TW); Cheng-Chi Chuang, New Taipei (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/159,309

(22) Filed: Jan. 27, 2021

(65) Prior Publication Data
US 2022/0069076 A1 Mar. 3, 2022

Related U.S. Application Data

(60) Provisional application No. 63/071,130, filed on Aug. 27, 2020.

(51) Int. Cl.
*H01L 29/06* (2006.01)
*H01L 29/08* (2006.01)
(Continued)

(52) U.S. Cl.
CPC ...... *H01L 29/0649* (2013.01); *H01L 29/0847* (2013.01); *H01L 29/66507* (2013.01); *H01L 29/7848* (2013.01)

(58) Field of Classification Search
CPC ..... H01L 21/823431; H01L 21/823821; H01L 21/845; H01L 29/66795–66818;
(Continued)

(56) References Cited

U.S. PATENT DOCUMENTS 3,802,504 A 4/1974 Garrett et al.
8,772,109 B2 7/2014 Colinge
(Continued)

FOREIGN PATENT DOCUMENTS

KR 20120086369 A 8/2012
KR 20130107183 A 10/2013
(Continued)

OTHER PUBLICATIONS

Su, Huan-Chieh, et al. "Backside Power Rail And Methods Of Forming The Same," U.S. Appl. No. 16/901,963, filed Jun. 15, 2020, Assignee: Taiwan Semiconductor Manufacturing Co., Ltd., 29 pages specification, 22 pages drawings.
(Continued)

*Primary Examiner* — Sonya McCall-Shepard
(74) *Attorney, Agent, or Firm* — Haynes and Boone, LLP

(57) ABSTRACT

A semiconductor structure includes one or more channel layers; a gate structure engaging the one or more channel layers; a first source/drain feature connected to a first side of the one or more channel layers and adjacent to the gate structure; a first dielectric cap disposed over the first source/drain feature, wherein a bottom surface of the first dielectric cap is below a top surface of the gate structure; a via disposed under and electrically connected to the first source/drain feature; and a power rail disposed under and electrically connected to the via.

20 Claims, 22 Drawing Sheets

(51) Int. Cl.
| | |
|---|---|
| *H01L 29/66* | (2006.01) |
| *H01L 29/78* | (2006.01) |
| *H01L 29/423* | (2006.01) |
| *H01L 29/45* | (2006.01) |
| *H01L 27/088* | (2006.01) |
| *H01L 21/8234* | (2006.01) |
| *H01L 21/8238* | (2006.01) |
| *H01L 27/092* | (2006.01) |
| *H01L 23/528* | (2006.01) |

(58) Field of Classification Search
CPC ..... H01L 29/41791; H01L 29/785–786; H01L 2029/7857–7858; H01L 27/0886; H01L 27/0924; H01L 27/10826; H01L 27/10879; H01L 27/1211; H01L 29/0673; H01L 29/42392; H01L 29/66787; H01L 29/78696; H01L 29/41725; H01L 29/7839; H01L 29/806; H01L 29/665–66507; H01L 29/7845; H01L 29/41783; H01L 21/82384; H01L 29/0843–0891; H01L 29/66636–66643; H01L 21/823418–823425; H01L 21/823814; H01L 29/66575–66598; H01L 29/66515; H01L 2224/29025; H01L 2224/29009; H01L 2224/02372; H01L 21/76898; H01L 23/481; H01L 29/0847; H01L 21/823871; H01L 29/7848; H01L 29/0649

See application file for complete search history.

(56) References Cited

U.S. PATENT DOCUMENTS

| | | | |
|---|---|---|---|
| 8,785,285 B2 | 7/2014 | Tsai et al. | |
| 8,803,292 B2 | 8/2014 | Chen et al. | |
| 8,803,316 B2 | 8/2014 | Lin et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,993,380 B2 | 3/2015 | Hou et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,520,482 B1 | 12/2016 | Chang et al. | |
| 9,576,814 B2 | 2/2017 | Wu et al. | |
| 9,704,835 B2 | 7/2017 | Feng et al. | |
| 9,711,555 B2 | 7/2017 | Lin et al. | |
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,020,261 B2 | 7/2018 | Wu et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,269,715 B2 | 4/2019 | Wu et al. | |
| 10,282,504 B2 | 5/2019 | Wu et al. | |
| 2017/0194211 A1* | 7/2017 | Lai .................. | H01L 21/823418 |
| 2018/0175036 A1 | 6/2018 | Ching et al. | |

FOREIGN PATENT DOCUMENTS

| | | |
|---|---|---|
| KR | 20150009936 A | 1/2015 |
| KR | 20190046846 A | 5/2019 |
| KR | 20190055677 A | 5/2019 |
| KR | 2020003722 A | 1/2020 |
| KR | 20200036733 A | 4/2020 |
| KR | 20200066561 A | 6/2020 |
| KR | 20200086606 A | 7/2020 |
| KR | 20200086607 A | 7/2020 |

OTHER PUBLICATIONS

Chiang, Kuo-Cheng, et al. "Semiconductor Devices With Backside Power Rail and Backside Self-Aligned Via," U.S. Appl. No. 17/080,521, filed Oct. 26, 2020, Assignee: Taiwan Semiconductor Manufacturing Co., Ltd., 37 pages specification, 24 pages drawings.

Chu, Feng-Ching, et al. "Epitaxial Source/Drain Feature with Enlarged Lower Section Interfacing with Backside Mia," U.S. Appl. No. 16/901,631, filed Jun. 15, 2020, Assignee: Taiwan Semiconductor Manufacturing Co., Ltd., 35 pages specification, 23 pages drawings.

Chen, Chun-Yuan, et al. "Semiconductor Devices with Backside Air Gap Dielectric," U.S. Appl. No. 16/888,217, filed May 29, 2020, Assignee: Taiwan Semiconductor Manufacturing Co, Ltd., 27 pages specification, 16 pages drawings.

Ju, Shi Ning, et al. "Finfet Devices With Backside Power Rail and Backside Self-Aligned Via," U.S. Appl. No. 17/081,894, filed Oct. 27, 2020, Assignee: Taiwan Semiconductor Manufacturing Co., Ltd., 34 pages specification, 22 pages drawings.

Chen, Chun-Yuan, et al. "Anchor-Shaped Backside Via and Method Thereof," U.S. Appl. No. 16/926,447, filed Jul. 10, 2020, Assignee: Taiwan Semiconductor Manufacturing Co., Ltd., 32 pages specification, 16 pages drawings.

Huang, Lin-Yu, et al."Selective Liner on Backside Via and Method Thereof," U.S. Appl. No. 16/944,263, filed Jul. 31, 2020, Assignee: Taiwan Semiconductor Manufacturing Co., Ltd., 30 pages specification, 36 pages drawings.

Chen, Chun-Yuan, et al., "Semiconductor Devices with Backside Contacts and Isolation," U.S. Appl. No. 17/104,351, Assignee: Taiwan Semiconductor Manufacturing Co., Ltd , 33 pages specification, 21 pages drawings.

Huang, Lin-Yu, et al., "Dumbbell Shaped Self-Aligned Capping Layer Over Source/Drain Contacts and Method Thereof", U.S. Appl. No. 16/901,572, filed Jun. 15, 2020, Assignee: Taiwan Semiconductor Manufacturing Co., Ltd., 33 pages specification, 21 pages drawings.

Chen, Hsin-Ping, et al., "Semiconductor Device with Conductors Embedded in a Substrate", U.S. Appl. No. 16/751,158, filed Jan. 24, 2020, Assignee: Taiwan Semiconductor Manufacturing Co., Ltd., 29 pages specification, 19 pages drawings.

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering University of Houston, Manuscript # JVSTA-A-14-332.

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Huang, Lin-Yu, et al., "Method for Forming Source/Drain Contacts Utilizing an Inhibitor", U.S. Appl. No. 16/881,481, filed May 22, 2020, Assignee: Taiwan Semiconductor Manufacturing Co, Ltd., 27 pages specification, 16 pages drawings.

* cited by examiner

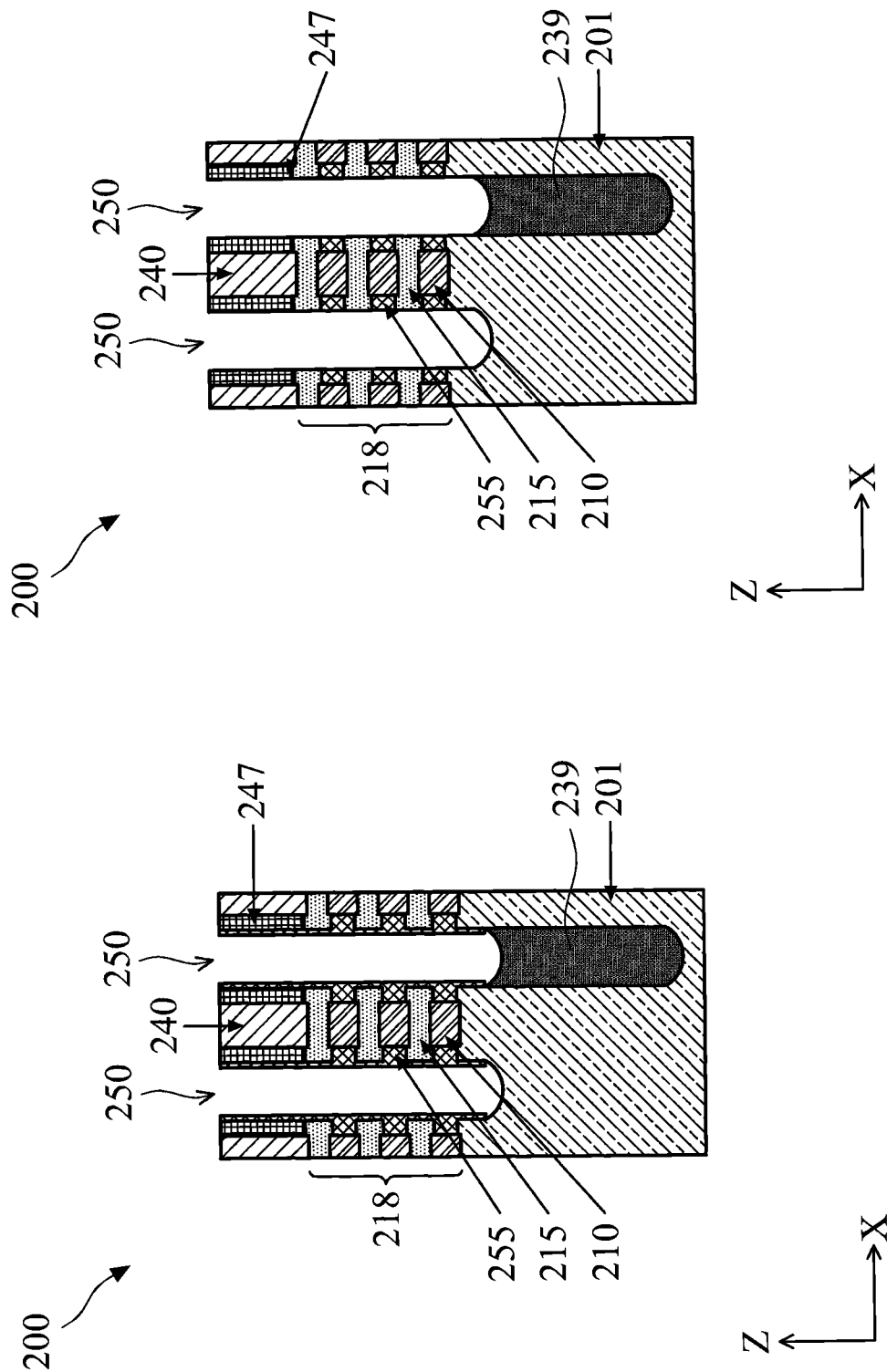

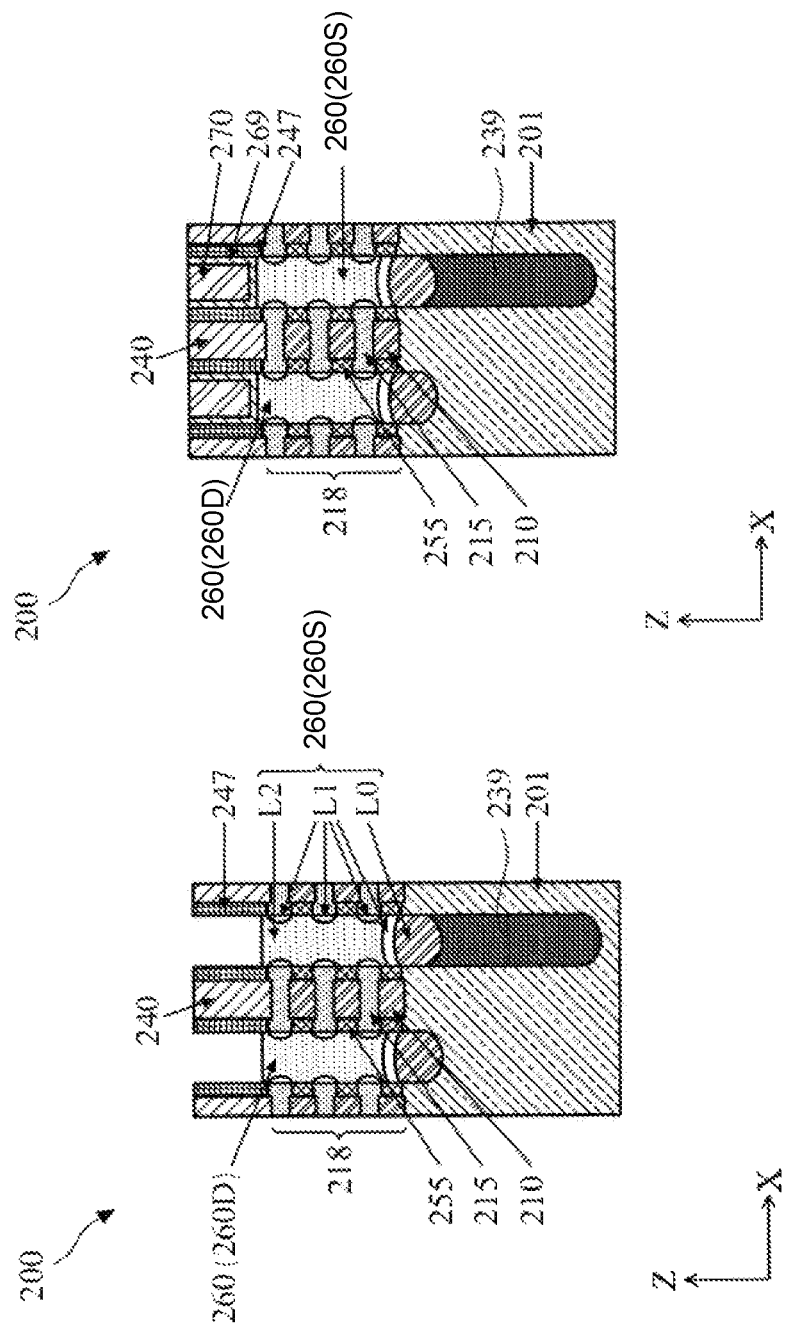

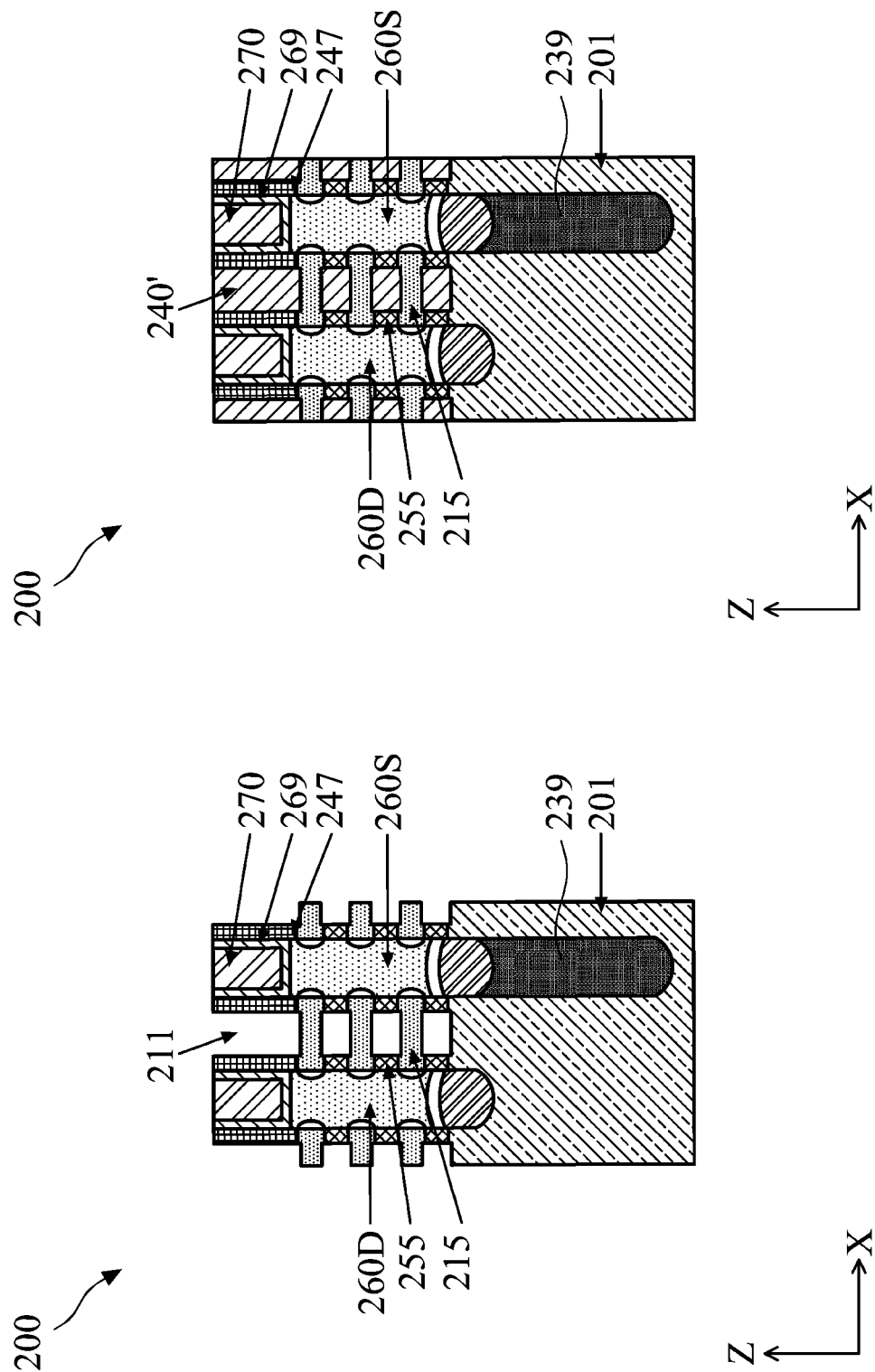

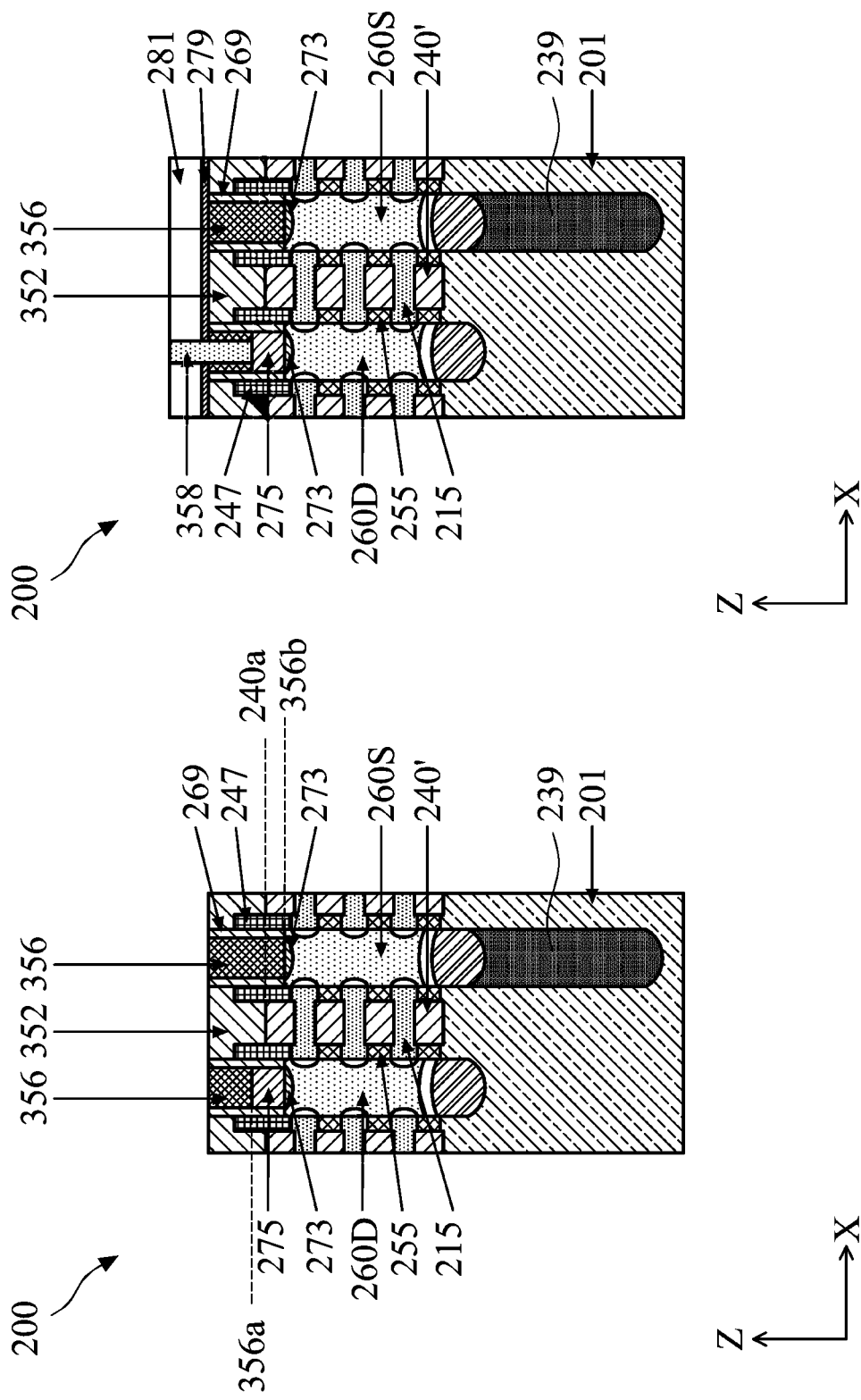

SEMICONDUCTOR DEVICES WITH BACKSIDE POWER RAIL AND METHOD THEREOF

PRIORITY

This claims the benefits of and priority to U.S. Provisional Application Ser. No. 63/071,130 filed Aug. 27, 2020, the entire disclosure of which is incorporated herein by reference.

BACKGROUND

Conventionally, integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 12, 13, 14, 15, 16, 17, 18, 19, 20, 21, 22, 23, 24, 25, 26, 27, 28, 29, and 30 illustrate cross-sectional views of a portion of the semiconductor device in FIG. 2A along the "B-B" of FIG. 2A, in intermediate steps of fabrication according to some embodiments of the method of FIGS. 1A-1D.

DETAILED DESCRIPTION

Figure 1A:
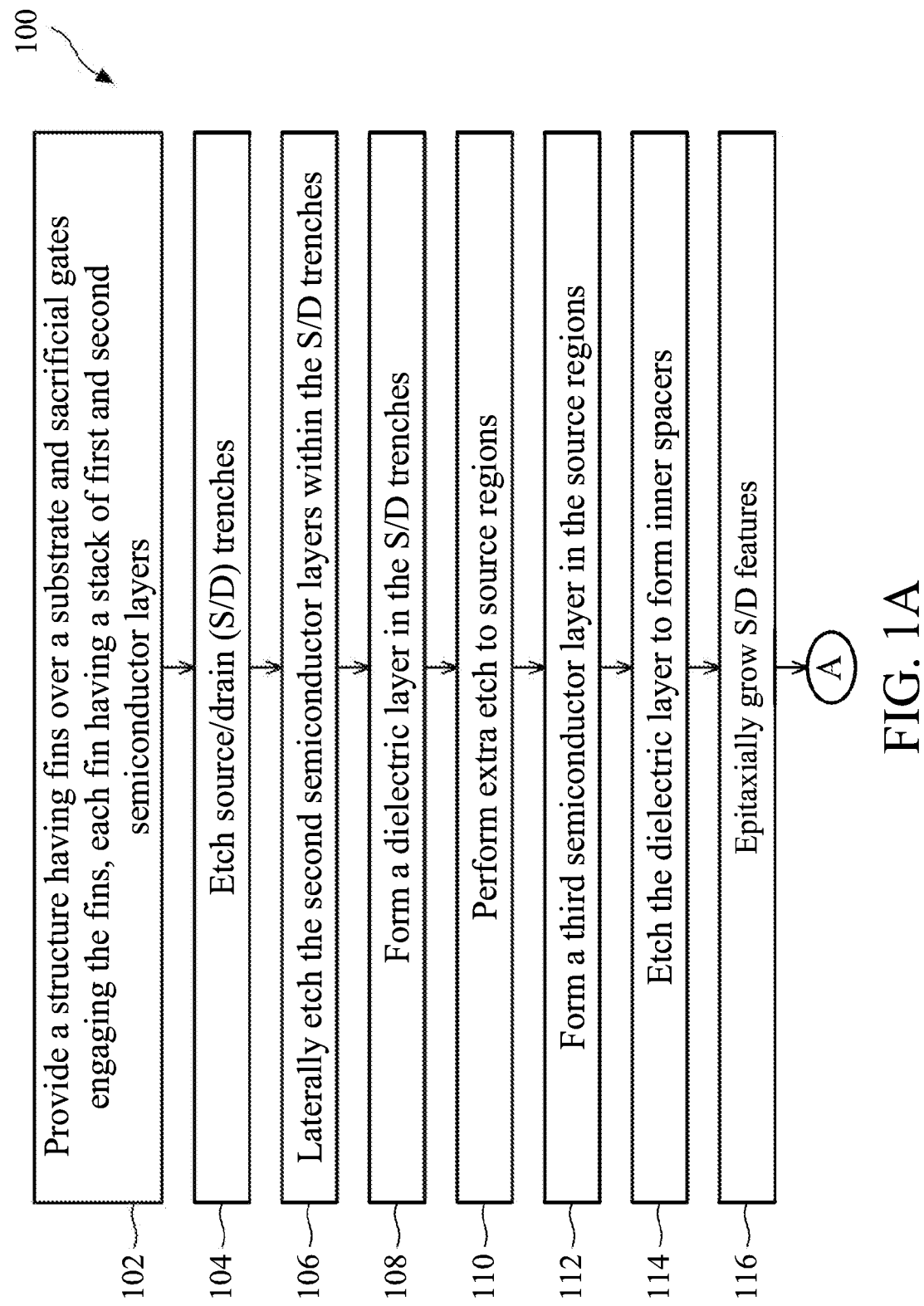
FIGS. 1A, 1B, 1C, and 1D show a flow chart of a method of forming a semiconductor device with backside power rails and backside self-aligned vias, according to various aspects of the present disclosure.
Figure 1B:
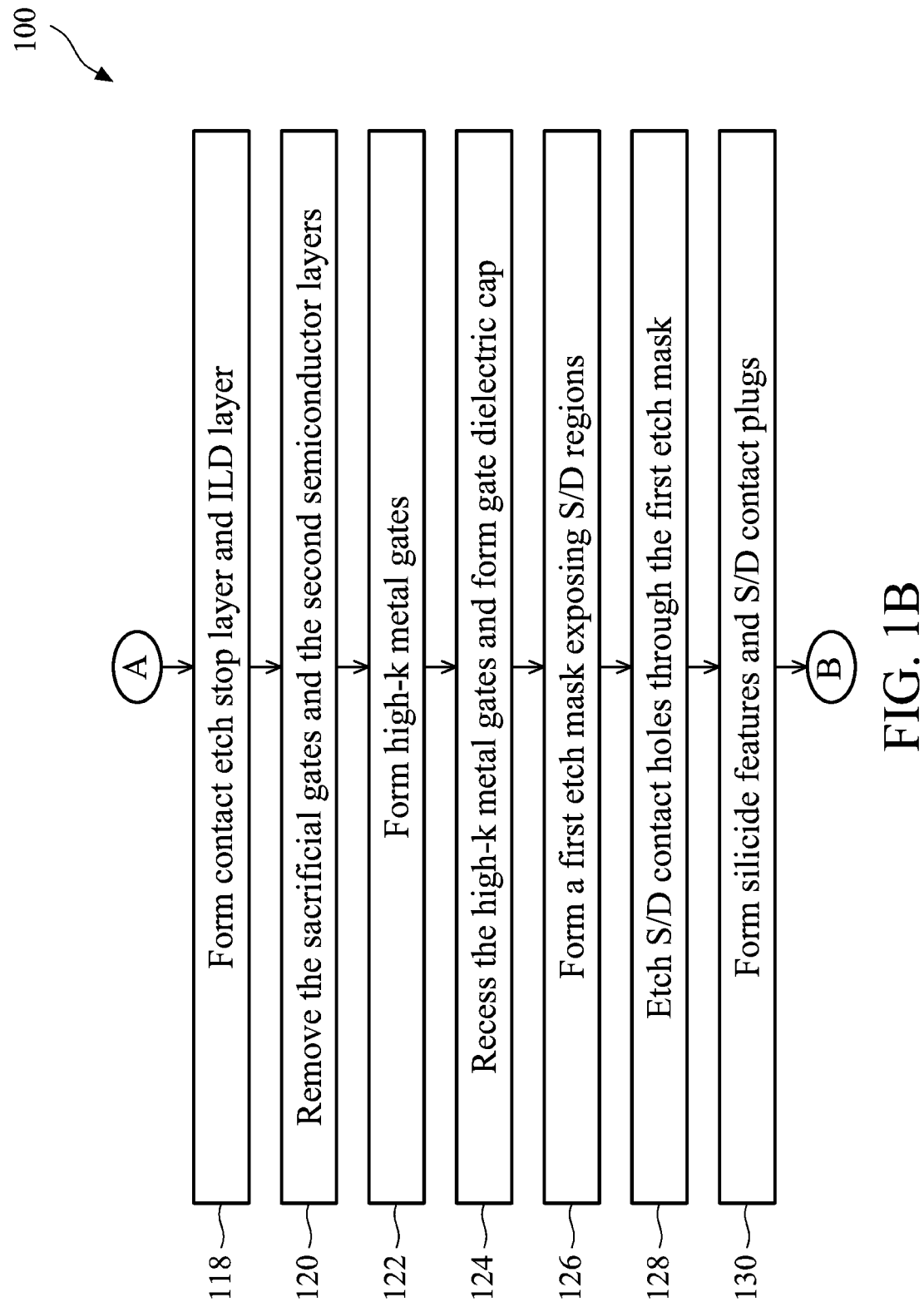
Figure 1C:
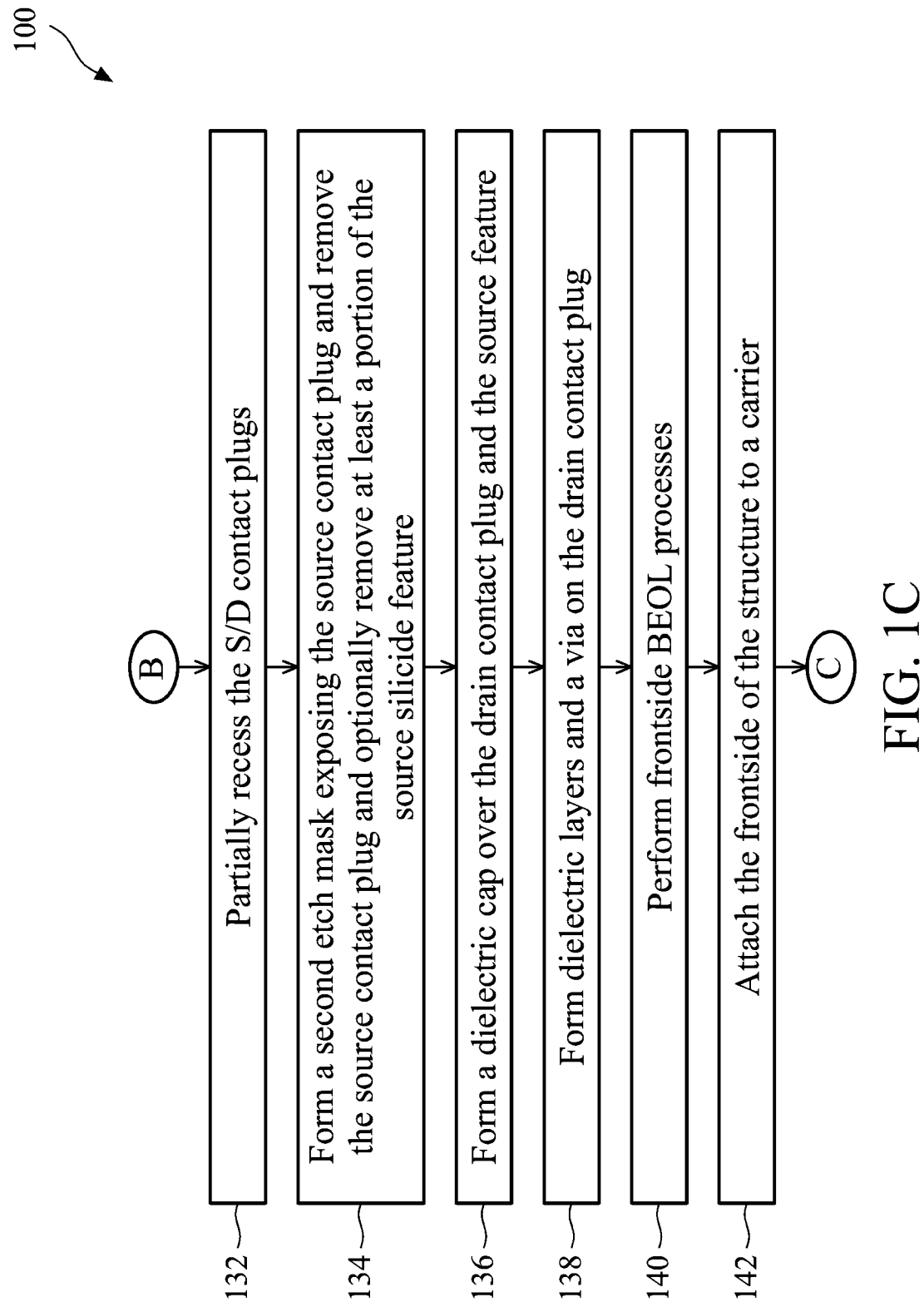
Figure 1D:
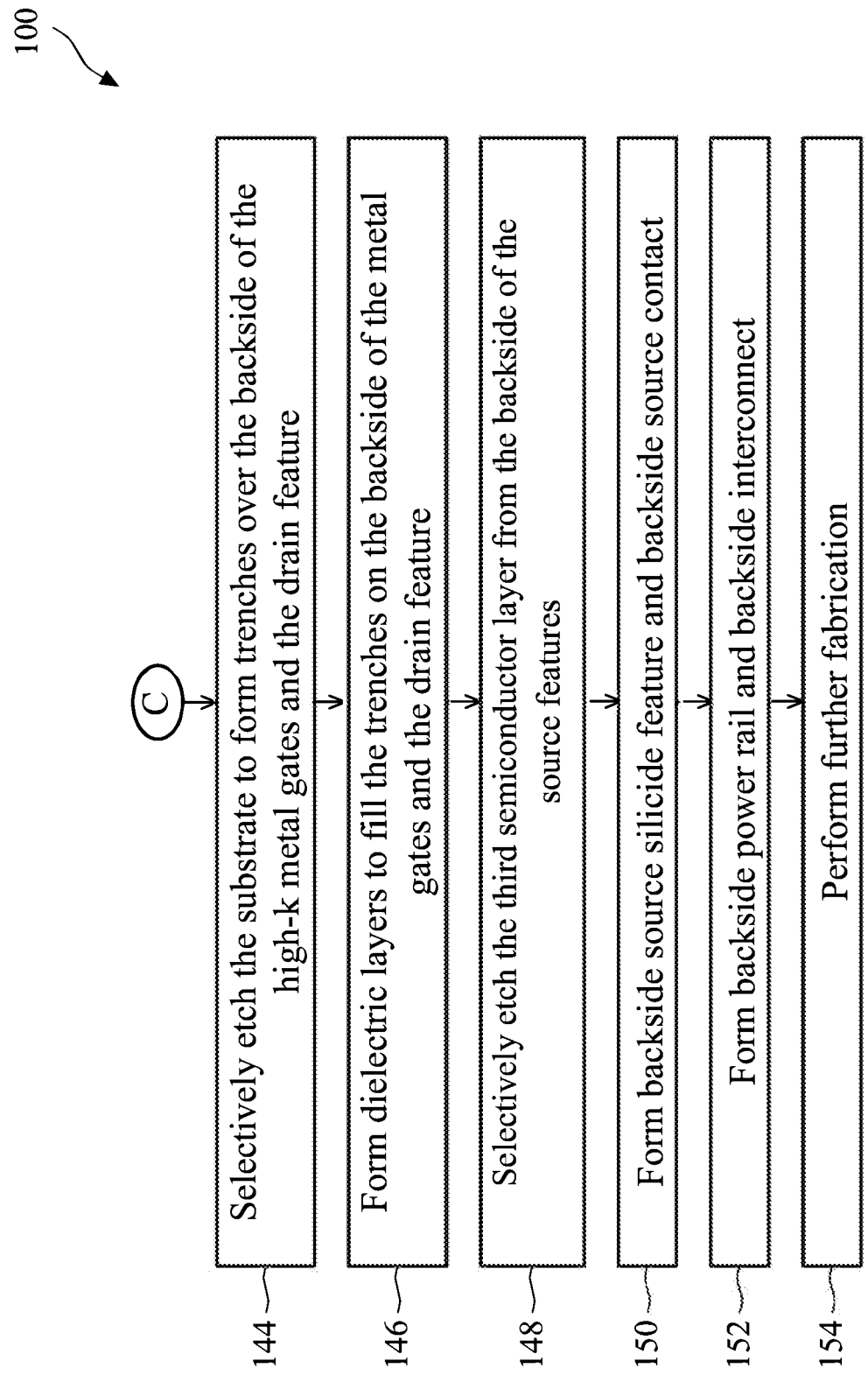

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside self-aligned vias. As discussed above, power rails (or power routings) in IC need further improvement in order to provide the needed performance boost as well as reducing power consumption. An object of the present disclosure includes providing power rails on a back side (or backside) of a structure containing transistors in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. With the addition of the backside power rails and backside vias, some of the source/drain features are accessed only through the backside of the semiconductor device and there is no need to provide contacts and/or other conductive features for such source/drain features at the frontside. Accordingly, the present disclosure provides methods for forming source and/or drain features with contacts on one side only (either frontside or backside), thereby reducing the coupling capacitance between source/drain features and nearby conductors such as metal gates, source/drain vias, and gate vias. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having backside power rail and backside self-aligned vias. For the purposes of simplicity, the present disclosure uses GAA devices as an example, and points out certain differences in the processes between GAA and FinFET embodiments. Those of ordinary skill in the art should appreciate that they may readily use the present disclosure as a basis for designing or modifying other processes and structures for carrying out the same purposes and/or achieving the same advantages of the embodiments introduced herein.

FIGS. 1A, 1B, 1C, and 1D are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 30 that illustrate various top, perspective, and cross-sectional views of a semiconductor device (or a semiconductor structure or a structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 30 have been simplified for the sake of clarity to better understand the inventive concepts of the present disclosure. Additional features can be added in the device 200, and some of the features described below can be replaced, modified, or eliminated in other embodiments of the device 200.

Figures 2A, 2B:
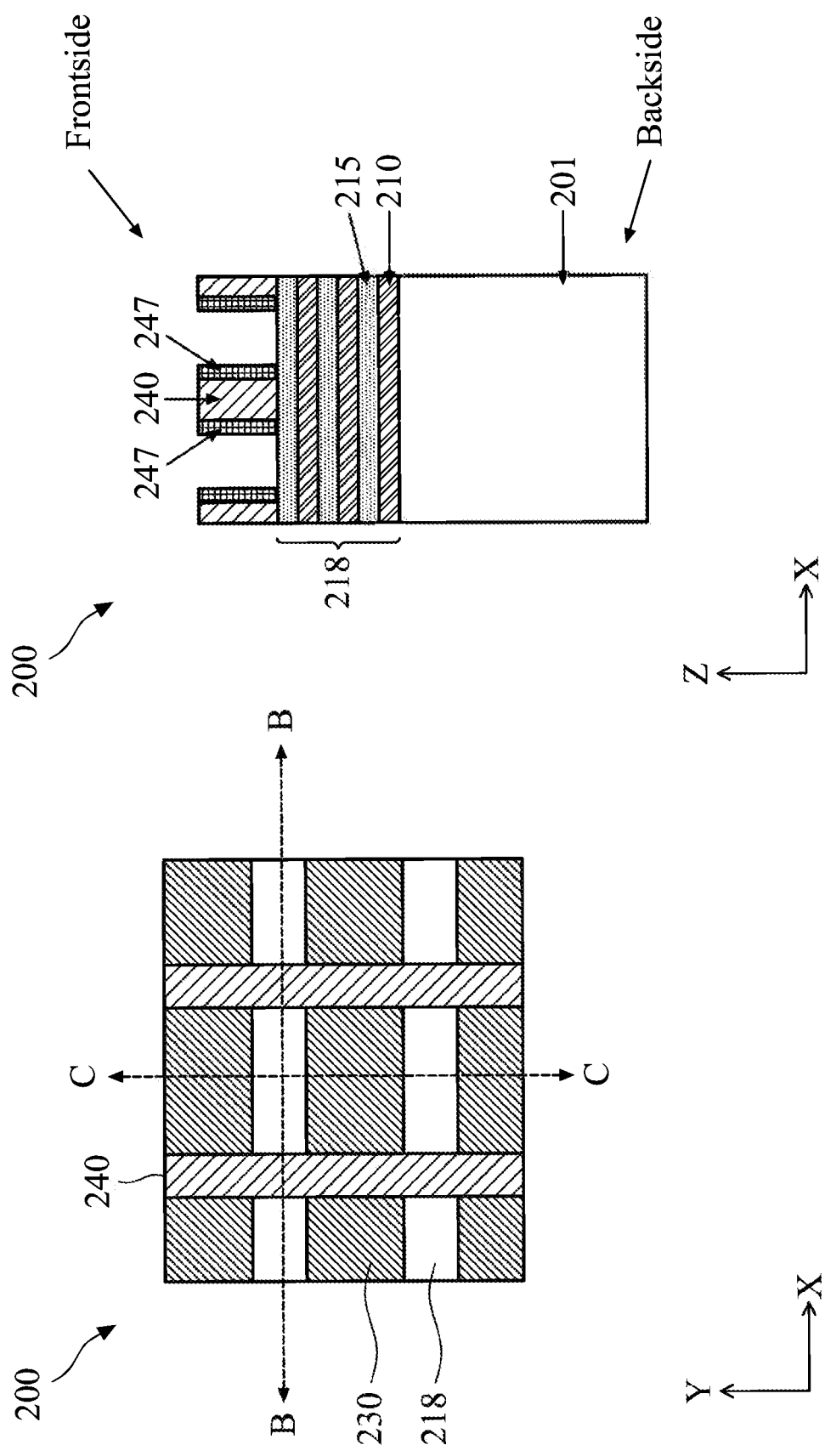
FIG. 2A illustrates a top view of a portion of a semiconductor device, according to some embodiments, in an intermediate step of fabrication according to an embodiment of the method of FIGS. 1A-1D.
FIGS. 2B and 2C illustrate cross-sectional views of a portion of the semiconductor device in FIG. 2A along the "B-B" and "C-C" lines of FIG. 2A respectively according to some embodiments.
Figure 2D:
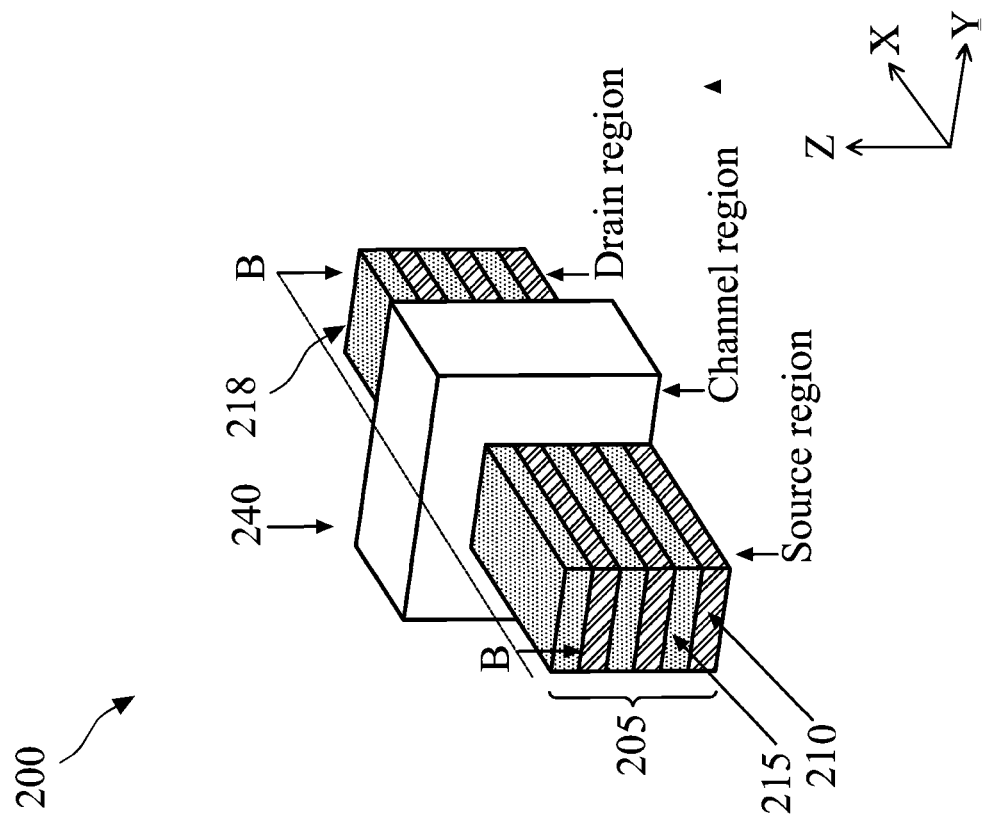
FIG. 2D illustrates a perspective view of a portion of the semiconductor device in FIG. 2A, according to some embodiments.
Figure 2C:
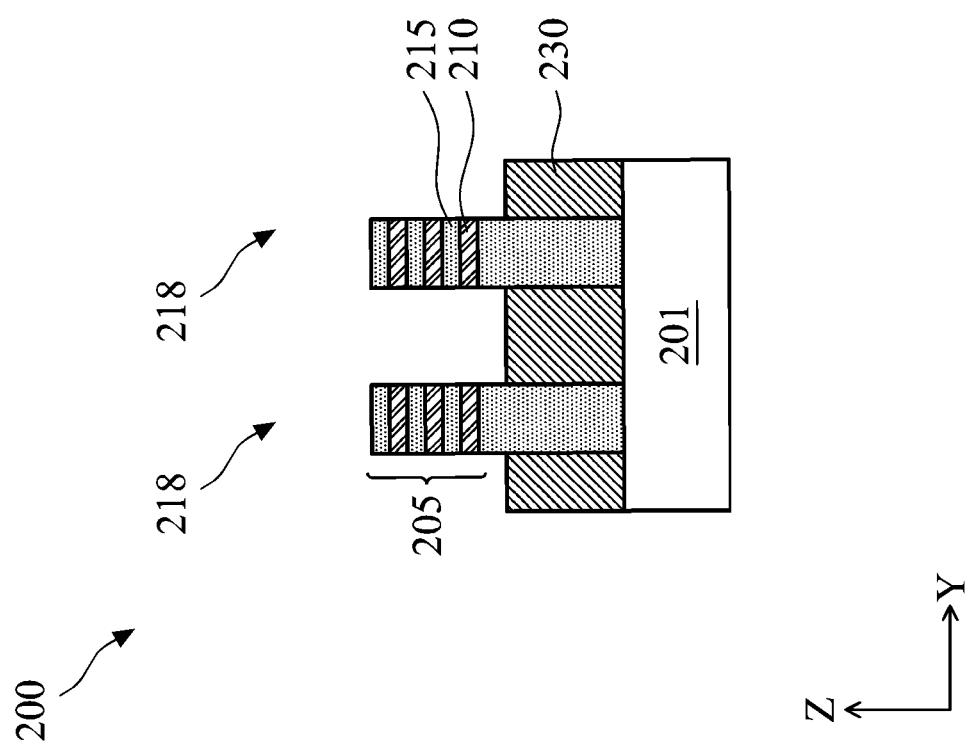

At operation 102, the method 100 (FIG. 1A) provides a structure 200 having a substrate 201, fins 218 over the substrate 201, and sacrificial (or dummy) gate stacks 240 engaging the fins 218. Referring to FIGS. 2A and 2D, the fins 218 are oriented lengthwise along the "x" direction and the sacrificial gate stacks 240 are oriented lengthwise along the "y" direction and engage the fins 218 at channel regions of transistors. The fins 218 are isolated from each other by an isolation structure 230 (FIG. 2A). FIG. 2B illustrates a cross-sectional view of a portion of the structure 200 along the "B-B" line of FIGS. 2A and 2D according to an embodiment. FIG. 2C illustrates a cross-sectional view of a portion of the structure 200 along the "C-C" line of FIG. 2A according to an embodiment. The following discussion refer to FIGS. 2A, 2B, 2C, and 2D collectively.

In an embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In another embodiment, the substrate 201 is a bulk silicon substrate (i.e., including bulk single-crystalline silicon), such as a silicon wafer. The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

Each fin 218 includes a stack 205 of semiconductor layers 210 and 215 that are stacked vertically (e.g., along the z-direction) in an interleaving or alternating configuration from a surface of the substrate 201. In some embodiments, semiconductor layers 210 and semiconductor layers 215 are epitaxially grown in the depicted interleaving and alternating configuration. For example, a first one of semiconductor layers 210 is epitaxially grown on the substrate 201, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215 configured to form three semiconductor layer pairs disposed over substrate 201, each semiconductor layer pair having a respective first semiconductor layer 210 and a respective second semiconductor layer 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200 (e.g., a GAA transistor) and/or design requirements of the device 200. For example, semiconductor layer stack 205 can include two to ten semiconductor layers 210 and two to ten semiconductor layers 215. In an alternative embodiment where the device 200 is a FinFET device, the stack 205 is simply one layer of a semiconductor material, such as one layer of silicon. As will be discussed, the method 100 will process layers at both sides of the substrate 201. In the present disclosure, the side of the substrate 201 where the stack 205 resides is referred to as the frontside and the side opposite the frontside is referred to as the backside.

In an embodiment, fins 218 are formed by patterning the stack 205 (after the stack of semiconductor layers 210 and 215 are grown) and the substrate 201. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 218 may be suitable.

The isolation structure 230 is formed over and/or in substrate 201 to isolate various regions of the device 200. For example, isolation structure 230 surrounds a bottom portion of fins 218 to separate and isolate fins 218 from each other. Isolation structure 230 includes silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures and/or deep trench isolation (DTI) structures. In an embodiment, isolation structure 230 can be formed by filling the trenches between fins 218 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation structure 230. In some embodiments, isolation structure 230 includes a multi-layer structure, such as a silicon nitride layer disposed over a thermal oxide liner layer.

The dummy gate stack 240 may include a dummy gate dielectric layer and a dummy gate electrode layer over the dummy gate dielectric layer. The dummy gate dielectric layer may include a dielectric material, such as silicon oxide, a high-k dielectric material, other suitable dielectric material. The dummy gate electrode layer may include polysilicon or other suitable material. The dummy gate stack 240 may further include one or more hard mask layers over the dummy gate electrode layer, where the one or more hard mask layers may include silicon oxide, silicon nitride, or other suitable materials. Dummy gate stacks 240 are formed by deposition processes, lithography processes, etching processes, other suitable processes, or combinations thereof. The deposition process may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. A lithography patterning and etching process is then performed to pattern the one or more hard mask layers, the dummy gate electrode layer, and the dummy gate dielectric layer to form the dummy gate stacks 240, as depicted in FIGS. 2A, 2B, and 2D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

The structure 200 further includes gate spacers 247 on sidewalls of the dummy gate stacks 240 (such as shown in FIG. 2B). Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In such implementations, the various sets of spacers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited and etched to form a second spacer set adjacent to the first spacer set.

Figure 3:
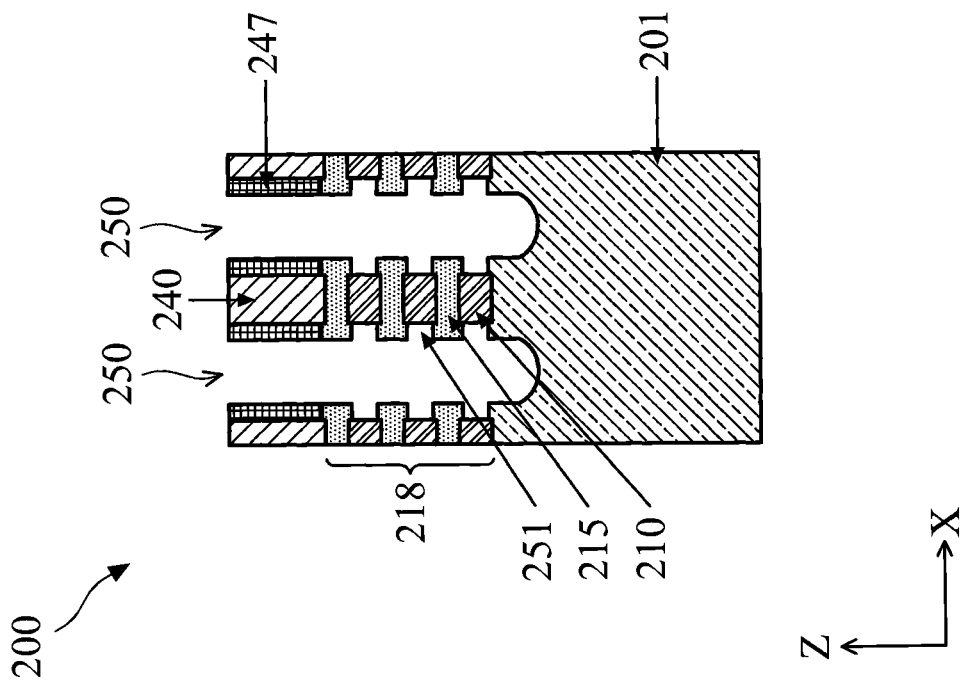

At operation 104, the method 100 (FIG. 1A) forms source/drain (S/D) trenches 250 by etching the fins 218 adjacent the gate spacers 247. The resultant structure is shown in FIG. 3 according to an embodiment. In the depicted embodiment, an etching process completely removes semiconductor layer stack 205 in source/drain regions of fins 218 thereby exposing the substrate 201 in the source/drain regions. Source/drain trenches 250 thus have sidewalls defined by remaining portions of semiconductor layer stack 205, which are disposed in channel regions under the gate stacks 240, and bottoms defined by substrate 201. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the substrate portion of fins 218, such that source/drain trenches 250 extend below a topmost surface of substrate 201. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of dummy gate stacks 240 and/or isolation features 230. In some embodiments, a lithography process, such as those described herein, is performed to form a patterned mask layer that covers dummy gate stacks 240 and/or isolation features 230, and the etching process uses the patterned mask layer as an etch mask.

Figure 4:
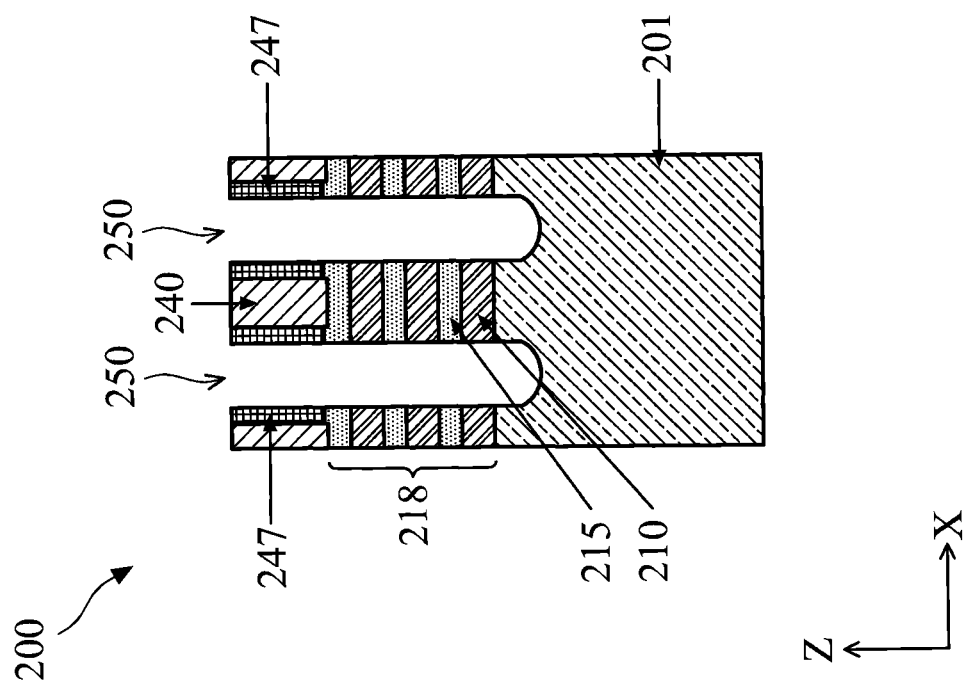

At operation 106, the method 100 (FIG. 1A) laterally etches the semiconductor layers 210 that are exposed in the source/drain (S/D) trenches 250, thereby forming gaps 251 vertically between adjacent semiconductor layers 215. The resultant structure is shown in FIG. 4 according to an embodiment. For example, an etching process is performed that selectively etches semiconductor layers 210 exposed by source/drain trenches 250 with minimal (to no) etching of semiconductor layers 215, such that gaps 251 are formed between semiconductor layers 215 and between semiconductor layers 215 and substrate 201 under gate spacers 247. Portions (edges) of semiconductor layers 215 are thus suspended in the channel regions under gate spacers 247. In some embodiments, the gaps 251 extend partially under dummy gate stacks 240. The etching process is configured to laterally etch (e.g., along the "x" direction) semiconductor layers 210, thereby reducing a length of semiconductor layers 210 along the "x" direction. The etching process may be a dry etching process, a wet etching process, other suitable etching process, or combinations thereof. In embodiments where the device 200 is a FinFET, the operation 106 is omitted.

Figure 5:
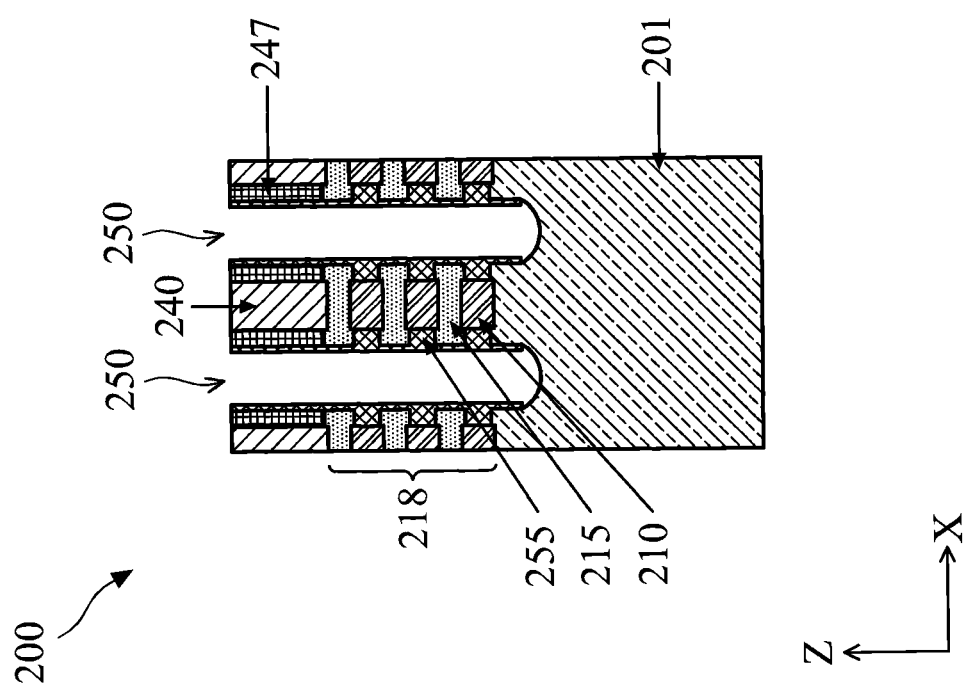

At operation 108, the method 100 (FIG. 1A) forms a dielectric layer (or a spacer precursor layer) 255 in the source/drain (S/D) trenches 250. The resultant structure is shown in FIG. 5 according to an embodiment. Referring to FIG. 5, the dielectric layer 255 is formed on sidewalls of the gate spacers 247, on sidewalls of the semiconductor layers 210 and 215, and in the gaps 251. The substrate 201 is exposed at the bottom of the S/D trenches 250. In an embodiment, the dielectric layer 255 is initially deposited over dummy gate stacks 240 and over features defining source/drain trenches 250. The dielectric layer 255 partially (and, in some embodiments, completely) fills the source/drain trenches 250. The dielectric layer 255 may be deposited using CVD, PVD, ALD, HDPCVD, MOCVD, RPCVD, PECVD, LPCVD, ALCVD, APCVD, other suitable methods, or combinations thereof. The deposition process is configured to ensure that the dielectric layer 255 fills the gaps 251 between semiconductor layers 215 and between semiconductor layers 215 and substrate 201 under gate spacers 247. An etching process (or pull-back process) is then performed that selectively etches the dielectric layer 255 to partially remove it from the S/D trenches 250 and to expose the substrate 201 with a portion of the dielectric layer 255 remaining on the sidewalls of gate spacers 247 and the sidewalls of semiconductor layers 210 and 215. The dielectric layer 255 includes a material that is different than a material of semiconductor layers 215 and a material of gate spacers 247 to achieve desired etching selectivity during another etching process (discussed below with reference to operation 110). In some embodiments, the dielectric layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the dielectric layer 255 includes a low-k dielectric material, such as those described herein.

Figure 6:
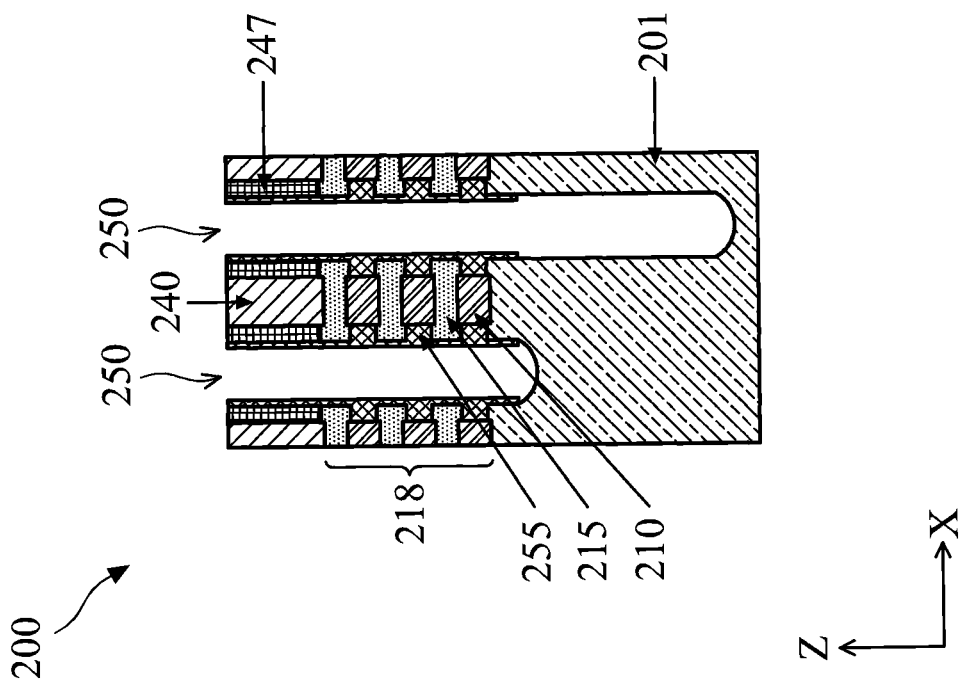

At operation 110, the method 100 (FIG. 1A) performs extra etching to the source region of the device 200 in an embodiment. In an alternative embodiment, the method 100 performs extra etching to the drain region of the device 200 instead of the source region. The resultant structure is shown in FIG. 6 according to an embodiment. In an embodiment, the operation 110 forms an etch mask (such as a patterned resist over a patterned hard mask, not shown) that covers the device 200 except the source regions, which are exposed through openings in the etch mask. Then, the operation 110 etches the source regions deeply in the substrate 201 until only a thin layer of the substrate 201 remains in the source trench 250, thereby extending the source trench 250 into the substrate 201. The etching process may include dry etching, wet etching, reactive ion etching, or other suitable etching. The etching process is substantially anisotropic (i.e., substantially vertical) in this embodiment. Also, the etching process is tuned selective to the material of the substrate 201 and with no (or minimal) etching to the dielectric layer 255, the gate spacers 247, and the dummy gate stacks 240.

At operation 112, the method 100 (FIG. 1A) forms a semiconductor layer 239 in the source trenches 250 with the etch mask from the operation 110 still in place. The resultant structure is shown in FIG. 7 according to an embodiment. The semiconductor layer 239 may be deposited using an epitaxial growth process or by other suitable processes. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in substrate 201 to achieve etching selectivity during subsequent processing. For example, semiconductor layer 239 and substrate 201 may include different materials, different constituent atomic percentages, different constituent weight percentages, and/or other characteristics to achieve desired etching selectivity during an etching process. In an embodiment, the substrate 201 includes silicon and the semiconductor layer 239 includes silicon germanium. In another embodiment, semiconductor layer 239 and substrate 201 can both include silicon germanium, but with different silicon atomic percent. The present disclosure contemplates that semiconductor layer 239 and substrate 201 include any combination of semiconductor materials that can provide desired etching selectivity, including any of the semiconductor materials disclosed herein. Since the drain regions are still covered by the etch mask formed in operation 110, the semiconductor layer 239 is only deposited in the source regions. The semiconductor layer 239 may be deposited to a thickness such that it is near the bottom of the stack 205 and is about even with the top surface of the isolation features 230 (FIG. 2C). After the semiconductor layer 239 is deposited, operation 112 removes the etch mask formed in operation 110. As will be discussed below, the extra etching in operation 110 and the growing of the semiconductor layer 239 in operation 112 can be performed in source regions only, drain regions only, or both source and drain regions in various embodiments.

At operation 114, the method 100 (FIG. 1A) etches the dielectric layer 255 such that the sidewalls of the semiconductor layer 215 are exposed in the S/D trenches 250 and a portion of the dielectric layer 255 remains along sidewalls of the semiconductor layers 210 inside the S/D trenches 250, such as shown in FIG. 8 according to an embodiment. The remaining portion of the dielectric layer 255 is referred to as inner spacers 255. For example, an etching process is performed that selectively etches the dielectric layer 255 to form inner spacers 255 as depicted in FIG. 8 with minimal (to no) etching of semiconductor layers 215, dummy gate stacks 240, and gate spacers 247. In embodiments where the device 200 is a FinFET, the dielectric layer 255 is completely removed from the S/D trenches 250.

At operation 116, the method 100 (FIG. 1A) epitaxially grows semiconductor S/D features 260 (including source features 260S and drain features 260D) in the S/D trenches 250. The resultant structure is shown in FIG. 9 according to an embodiment. As shown in FIG. 9, epitaxial S/D features 260 are grown from the semiconductor layer 239 and substrate 201 at the bottom of the S/D trenches 250 and from the semiconductor layers 215 at the sidewalls of the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 201, 239, and 215 (in particular, semiconductor layers 215). Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. For example, in the embodiment depicted in FIG. 9, each of the S/D features 260 includes three layers L0, L1, and L2. The layer L0 is disposed at the bottom of the S/D trenches 250, the layer L1 is disposed over the layer L0, and the layer L2 is disposed over the layer L1. In an embodiment, the layer L0 includes a different material than that in the layers L1 and L2 so as to provide etch selectivity between the layer L0 and the layers L1 and L2 during backside via formation process. For example, in an embodiment, the layer L0 includes SiGe and the layers L1 and L2 include Si (for n-type transistor). For example, in another embodiment, the layer L0 includes SiGe with a first Ge atomic percent and the layers L1 and L2 include SiGe (for p-type transistor) with a second Ge atomic percent and the first and the second Ge atomic percent are different. Further, the layer L2 may include a higher doping concentration than the layer L1 so as to reduce sheet resistance of the S/D features 260 and to reduce S/D contact resistance. In some embodiments, epitaxial S/D features 260 include materials and/or dopants that achieve desired tensile stress and/or compressive stress in respective channel regions. In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type GAA transistor regions when forming epitaxial source/drain features 260 in n-type GAA transistor regions and masking n-type GAA transistor regions when forming epitaxial source/drain features 260 in p-type GAA transistor regions.

At operation 118, the method 100 (FIG. 1B) forms a contact etch stop layer (CESL) 269 and an inter-layer dielectric (ILD) layer 270. The resultant structure is shown in FIG. 10 according to an embodiment. As shown in FIG. 10, the CESL 269 is deposited over the S/D features 260 and over sidewalls of the gate spacers 247, and the ILD layer 270 is deposited over the CESL 269 and fills the space between opposing gate spacers 247. The CESL 269 includes a material that is different than ILD layer 270. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate stacks 240. In some embodiments, the planarization process removes hard mask layers of dummy gate stacks 240 to expose underlying dummy gate electrodes, such as polysilicon gate electrode layers.

At operation 120, the method 100 (FIG. 1B) removes the dummy gate stacks 240 and the semiconductor layers 210 using one or more etching process. This forms a gate trench 211. The resultant structure is shown in FIG. 11 according to an embodiment. This involves a variety of processes as briefly described below. First, the operation 120 removes the dummy gate stacks 240 using one or more etching process to expose the semiconductor layers 210 and 215 in the channel region. The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 270, gate spacers 247, isolation features 230, semiconductor layers 215, and semiconductor layers 210. Next, the operation 120 removes the semiconductor layers 210 exposed in the channel region, leaving the semiconductor layers 215 suspended over the substrate 201 and connected with the S/D features 260. This process is also referred to as a channel release process and the semiconductor layers 215 are also referred to as channel layers. The etching process selectively etches semiconductor layers 210 with minimal (to no) etching of semiconductor layers 215 and, in some embodiments, minimal (to no) etching of gate spacers 247 and/or inner spacers 255. In embodiments where the device 200 is a FinFET, the channel release process is omitted because there is only a channel layer 215 and there are no semiconductor layers 210 in the channel region.

At operation 122, the method 100 (FIG. 1B) forms a functional gate structure 240' in the gate trench 211. The resultant structure is shown in FIG. 12 according to an embodiment. In an embodiment, the functional gate structure 240' includes a gate dielectric layer that wraps around each of the semiconductor layers 215 and a gate electrode over the gate dielectric layer. The gate dielectric layer may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The gate dielectric layer may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer and the semiconductor layers 215. The interfacial layer may include silicon dioxide, silicon oxynitride, or other suitable materials. In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes. Since the gate structure 240' includes a high-k dielectric layer and metal layer(s), it is also referred to as a high-k metal gate.

Figures 13, 14:
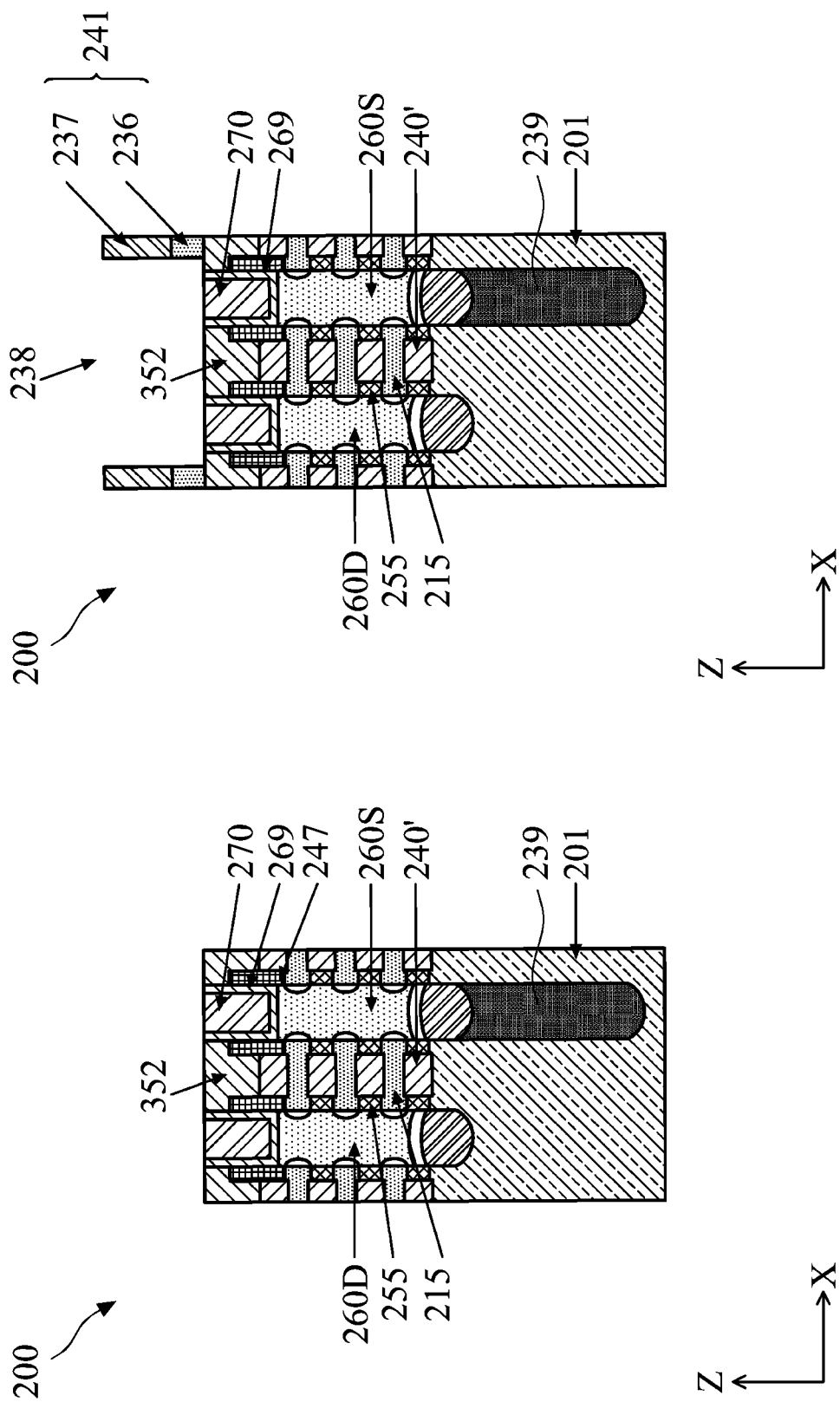

At operation 124, the method 100 (FIG. 1B) partially recesses the gate structure 240' and optionally the gate spacer 247, and then forms a gate dielectric cap 352 over the recessed gate structure 240' and optionally the recessed gate spacer 247. The resultant structure is shown in FIG. 13 according to an embodiment. The gate structure 240' and the gate spacer 247 may be recessed by a dry etching process, a wet etching process, other suitable etching process, or combinations thereof. The etching process is configured to selectively etch the gate structure 240' and the gate spacer 247 with minimal (to no) etching of other features of the device 200, such as CESL 269 and ILD layer 270. The etching process forms trenches between adjacent CESL 269 and over remaining portions of the gate structure 240' and the gate spacer 247. Then, operation 124 deposits the gate dielectric cap 352 in the trenches. In some embodiments, the gate dielectric cap 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The gate dielectric cap 352 protects the gate structure 240' from etching and CMP processes that are used for etching S/D contact holes. The gate dielectric cap 352 may have a thickness (along the "z" direction) in a range of about 0 nm (not existent) to about 50 nm and a width (along "x" direction) in a range of about 5 nm to about 30 nm, for example.

At operation 126, the method 100 (FIG. 1B) forms an etch mask 241. The resultant structure is shown in FIG. 14 according to an embodiment. The etch mask 241 includes openings 238 that expose the regions of the structure 200 where S/D contact holes will be formed, while the rest of the structure 200 is covered by the etch mask 241. The etch mask 241 includes a patterned hard mask 236 and a patterned resist 237 in this embodiment. The etch mask 241 may additionally include a bottom anti-reflective coating (BARC) layer between the patterned hard mask 236 and the patterned resist 237 in some embodiments. The patterned resist 237 may be formed using resist coating (for example, spin-on coating), soft baking, mask aligning, exposure, post-exposure baking, resist developing, rinsing, drying (for example, hard baking), other suitable lithography processes, or combinations thereof. The patterned hard mask 236 may be formed by depositing a hard mask layer before the patterned resist 237 is formed and etching the hard mask layer through the patterned resist 237 after the patterned resist 237 is formed.

Figures 15, 16:
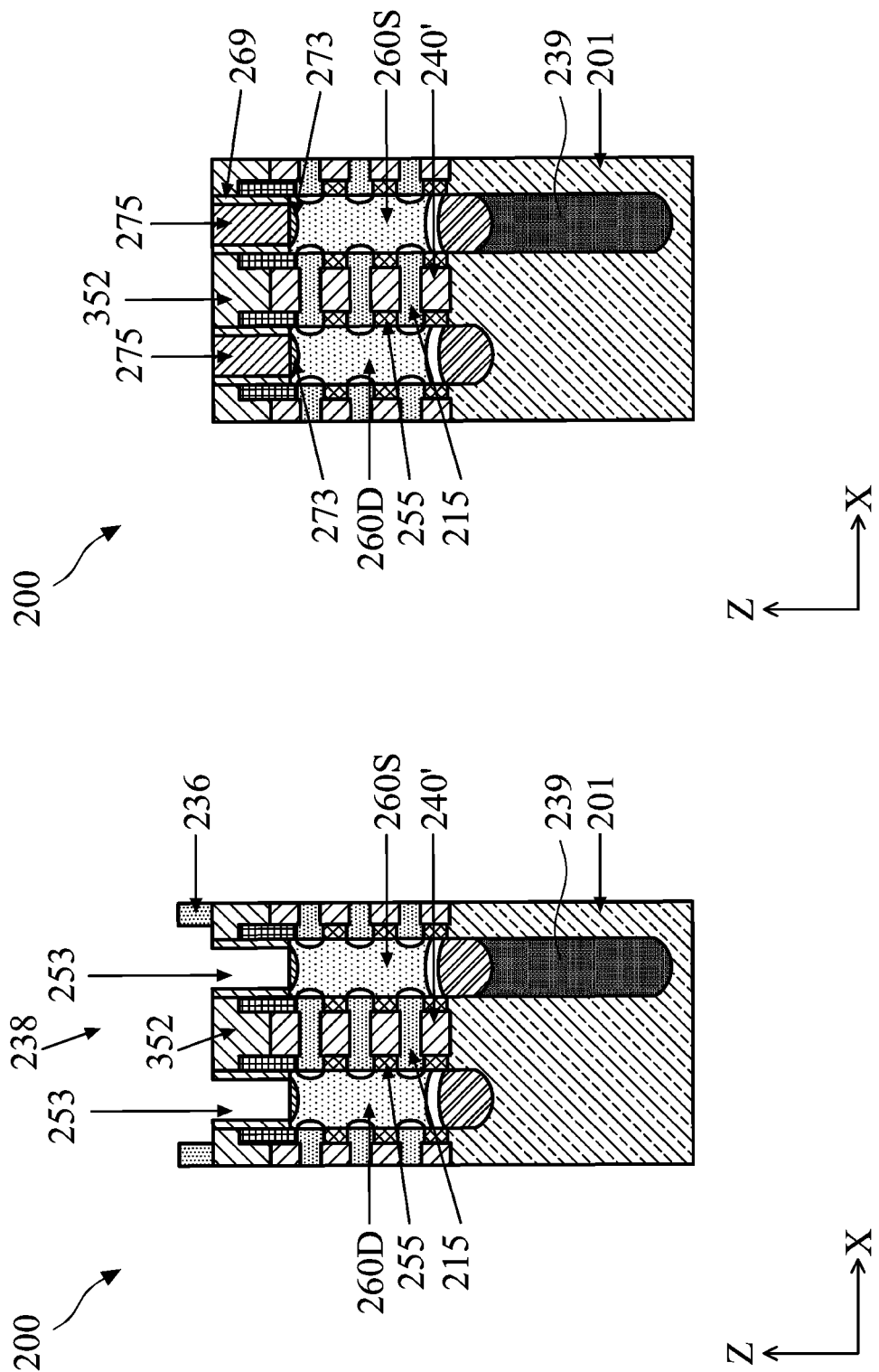

At operation 128, the method 100 (FIG. 1B) etches S/D contact holes 253 to expose some of the S/D features 260. The resultant structure is shown in FIG. 15 according to an embodiment. In an embodiment, the operation 128 includes a first etching process that is tuned selective to the materials of the ILD layer 270 with no (or minimal) etching to the CESL 269 and the gate dielectric cap 352. After the ILD layer 270 is removed from the contact holes 253, the operation 128 further includes a second etching process (anisotropic etching) that is tuned selective to the materials of the CESL 269 with no (or minimal) etching to the gate dielectric cap 352. The first and the second etching processes collectively form the contact holes 253 that expose the S/D features 260. The S/D features 260 may be partially etched in some embodiments. The etching processes can be dry etching, wet etching, reactive ion etching, or other etching methods. The patterned resist 237 may be partially or completely consumed during the above etching processes. After the contact holes are formed, the etch mask 241 is removed.

At operation 130, the method 100 (FIG. 1B) form silicide features 273 over the S/D features 260 and form S/D contacts (or contact plugs) 275 over the silicide features 273. The resultant structure is shown in FIG. 16 according to an embodiment. Since the silicide features 273 and the S/D contacts 275 are formed at the frontside of the device 200, they are also referred to as frontside silicide features 273 and frontside S/D contacts 275 respectively. In an embodiment, the operation 130 includes depositing one or more metals into the contact holes 253, performing an annealing process to the device 200 to cause reaction between the one or more metals and the S/D features 260 to produce the silicide features 273, and removing un-reacted portions of the one or more metals, leaving the silicide features 273 in the holes 253. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 275 may include a conductive barrier layer and a metal fill layer over the conductive barrier layer. The conductive barrier layer functions to prevent metal materials of the metal fill layer from diffusing into the dielectric layers adjacent the S/D contacts 275. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 275. The operation 130 may perform a CMP process to remove excessive materials of the S/D contacts 275.

Figures 17, 18:
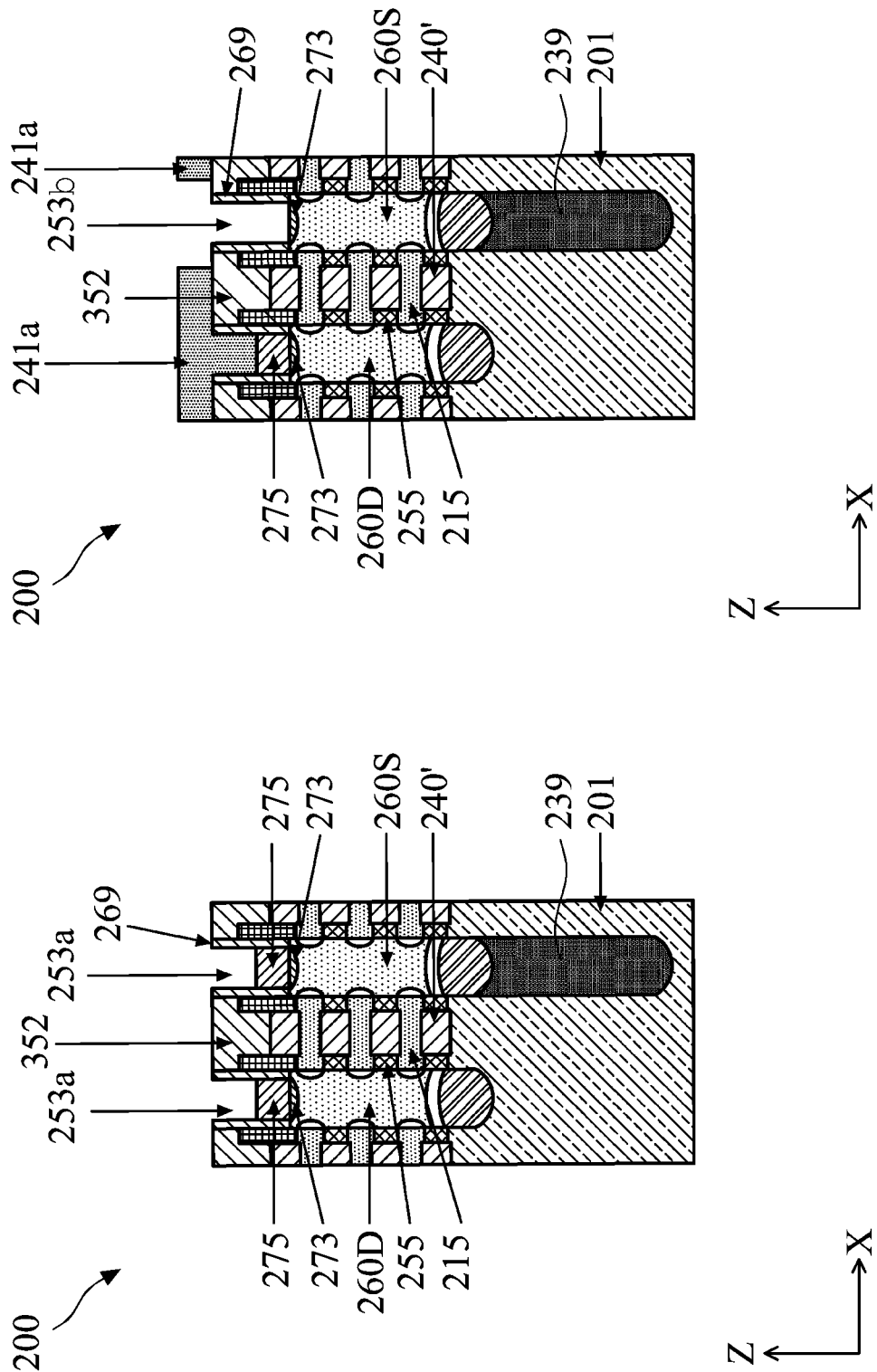

At operation 132, the method 100 (FIG. 1C) partially recesses the S/D contacts 275, for example, using a self-aligned etching process. The resultant structure is shown in FIG. 17 according to an embodiment. In an embodiment, the operation 132 includes an etching process that is tuned selective to the materials of the S/D contacts 275 with no (or minimal) etching to the CESL 269, the gate dielectric cap 352, and the ILD 270 (not shown in FIG. 17). The etching processes can be dry etching, wet etching, reactive ion etching, or other etching methods. In some embodiments, the remaining portion of the S/D contacts 275 have a thickness of about 10 nm to about 50 nm. The operation 132 may use a timer to control how deep the S/D contacts 275 are etched. The etching process reclaims a portion 253a of the contact holes 253. In some embodiments of the method 100, the operation 132 is omitted and the S/D contacts 275 are not partially recessed. In various embodiments, the depth of the holes 253a (along the "z" direction) may be in the range of 0 nm (when the operation 132 is omitted) to about 50 nm, and the width of the holes 253a (along the "x" direction) may be in the range of about 5 nm to about 30 nm.

Figure 28:
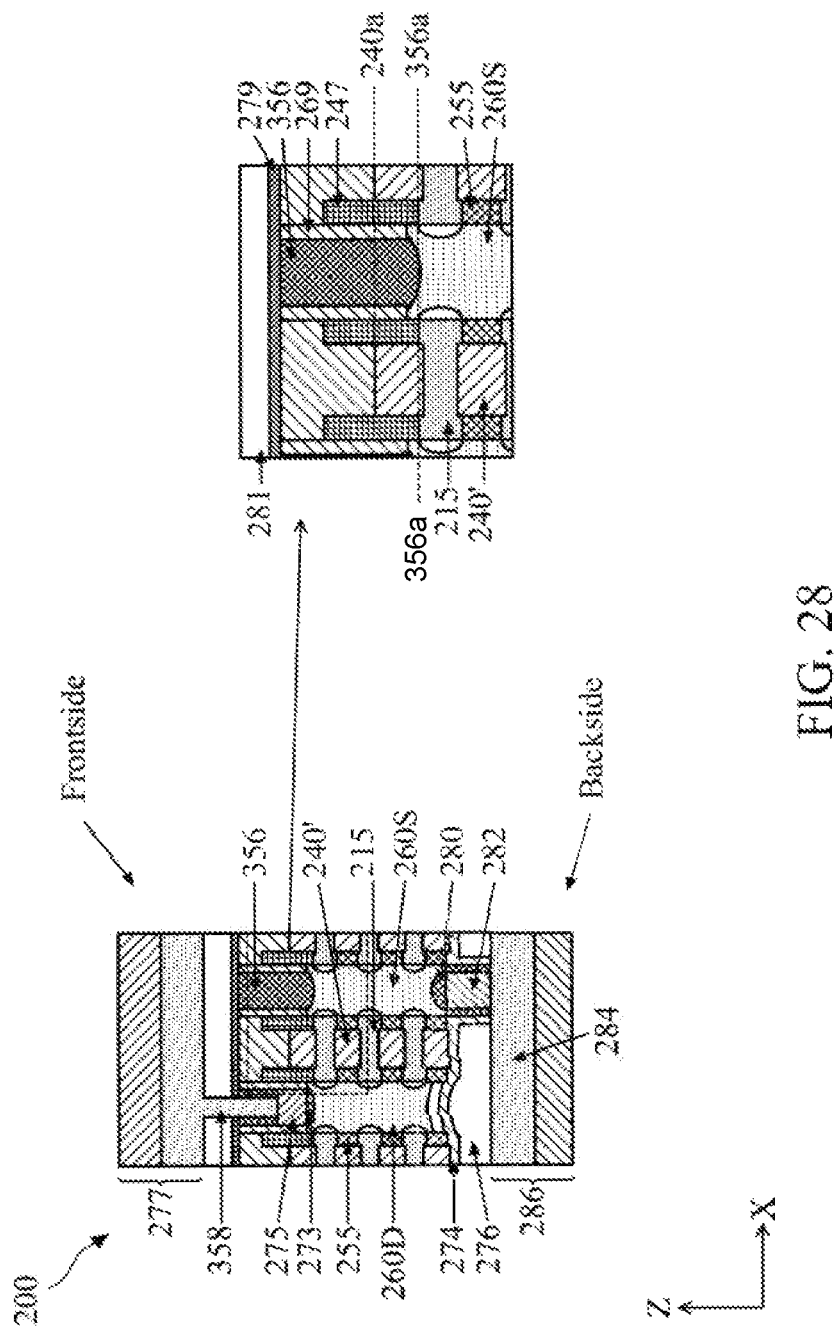

At operation 134, the method 100 (FIG. 1C) forms an etch mask 241a that exposes the source contact 275 (the S/D contact 275 above the source feature 260S) and covers the drain contact 275 (the S/D contact 275 above the drain feature 260D), and then removes the source contact 275 through the etch mask 241a using one or more etching processes. The resultant structure is shown in FIG. 18 according to an embodiment. In the present embodiment, the etching process(es) extends the hole 253a sufficiently deep to expose the silicide feature 273 above the source feature 260S. The extended hole 253a is labeled as 253b in FIG. 18. In another embodiment, the etching process(es) may partially or completely remove the silicide feature 273 above the source feature 260S, such as shown in FIG. 28. The etching process(es) is tuned selective to the materials of the source contact 275 with no (or minimal) etching to the CESL 269, the gate dielectric cap 352, and the etch mask 241a. The etching processes can be dry etching, wet etching, reactive ion etching, or other etching methods. The etch mask 241a includes a patterned resist in this embodiment and may additionally include a bottom anti-reflective coating (BARC) layer under the patterned resist in some embodiments. The etch mask 241a may be formed using resist coating (for example, spin-on coating), soft baking, mask aligning, exposure, post-exposure baking, resist developing, rinsing, drying (for example, hard baking), other suitable lithography processes, or combinations thereof. After the etching of the source contact 275 (and optionally the silicide feature 273) finishes, the operation 134 removes the etch mask 241a, thereby reclaiming the hole 253a above the drain feature 260D. The hole 253b is deeper than the hole 253a.

At operation 136, the method 100 (FIG. 1C) forms a dielectric cap 356 in the holes 253a (above the drain feature 260D) and 253b (above the source feature 260S). The resultant structure is shown in FIG. 19 according to an embodiment. In some embodiments, the dielectric cap 356 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). In various embodiments, the dielectric caps 352 and 356 may include the same material or different materials. The dielectric cap 356 above the source feature 260S may have a thickness (along the "z" direction) in a range of about 20 nm to about 50 nm and a width (along the "x" direction) in a range of about 5 nm to about 30 nm, for example. The dielectric cap 356 above the drain feature 260D may have a thickness (along the "z" direction) in a range of about 0 nm (not existent) to about 50 nm and a width (along the "x" direction) in a range of about 5 nm to about 30 nm, for example. The dielectric cap 356 may be deposited using CVD, PVD, ALD, or other suitable methods. The operation 136 may perform a CMP process to remove the portion of the dielectric cap 356 that is deposited outside of the holes 253a and 253b, such as those deposited on the dielectric cap 352 and the CESL 269. As shown in FIG. 19, the bottom surface 356b of the dielectric cap 356 above the source feature 260S is lower than the top surface 240a of the gate structure 240'. Further, in this embodiment, the bottom surface 356a of the dielectric cap 356 above the drain feature 260D is higher than the top surface 240a. In an alternative embodiment, the bottom surface 356a is lower than the top surface 240a but higher than the bottom surface 356b. As will be shown later, the source feature 260S is accessed through backside power rails and backside vias. Thus, there is no need to connect the frontside of the source feature 260S to an interconnect structure formed on the frontside of the structure 200 (frontside interconnect structure). By removing the source contact 275 (and optionally removing the silicide feature 273), the coupling capacitance between the source feature 260S and nearby conductive features such as the high-k metal gate 240' is advantageously reduced, thereby increasing the operating speed of the structure 200.

Further, the drain feature 260D is accessed through the drain contact 275 and the frontside interconnect structure.

At operation 138, the method 100 (FIG. 1C) forms dielectric layers 279 and 281 over the dielectric caps 352 and 356, the CESL 269, and the ILD 270 (not shown in FIG. 20), and forms a drain contact via 358 that penetrates the dielectric layers 281, 279, and 356 and electrically connects to the drain contact 275. The resultant structure is shown in FIG. 20 according to an embodiment. In an embodiment, the dielectric layer 279 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The dielectric layer 281 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The dielectric layer 281 may be formed by PECVD (plasma enhanced CVD), FCVD (flowable CVD), or other suitable methods. In an embodiment, the drain contact via 358 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the drain contact via 358. The operation 138 may form a gate via (not shown) connecting to the gate stacks 240' in some embodiments.

At operation 140, the method 100 (FIG. 1C) performs back-end-of-line (BEOL) processes at the frontside of the device 200. For example, the operation 140 may form one or more interconnect layers with wires and vias embedded in dielectric layers. The one or more interconnect layers connect gate, source, and drain electrodes of various transistors, as well as other circuits in the device 200. The operation 140 may also form passivation layer(s) over the interconnect layers. In the example shown in FIG. 21, a layer 277 is used to denote various dielectric and metal layers including interconnect layers and passivation layers formed at the frontside of the device 200.

Figures 21, 22:
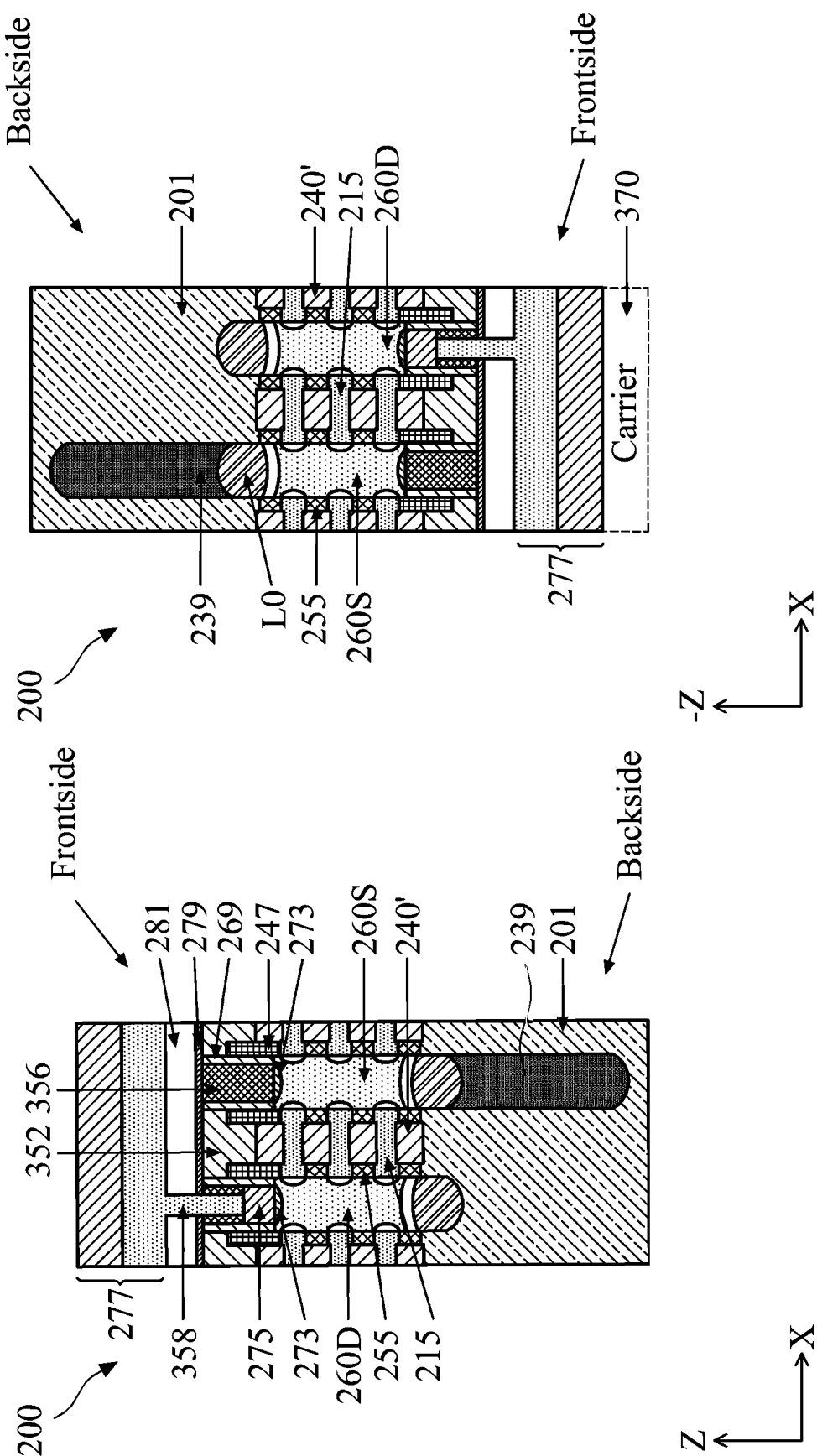

At operation 142, the method 100 (FIG. 1C) flips the device 200 upside down and attaches the frontside of the device 200 to a carrier 370, such as shown in FIG. 22. This makes the device 200 accessible from the backside of the device 200 for further processing. The operation 142 may use any suitable attaching processes, such as direct bonding, hybrid bonding, using adhesive, or other bonding methods. The operation 142 may further include alignment, annealing, and/or other processes. The carrier 370 may be a silicon wafer in some embodiment. In the figures of the present disclosure, the "z" direction points from the backside of the device 200 to the frontside of the device 200, while the "−z" direction points from the frontside of the device 200 to the backside of the device 200.

Figures 23, 24:
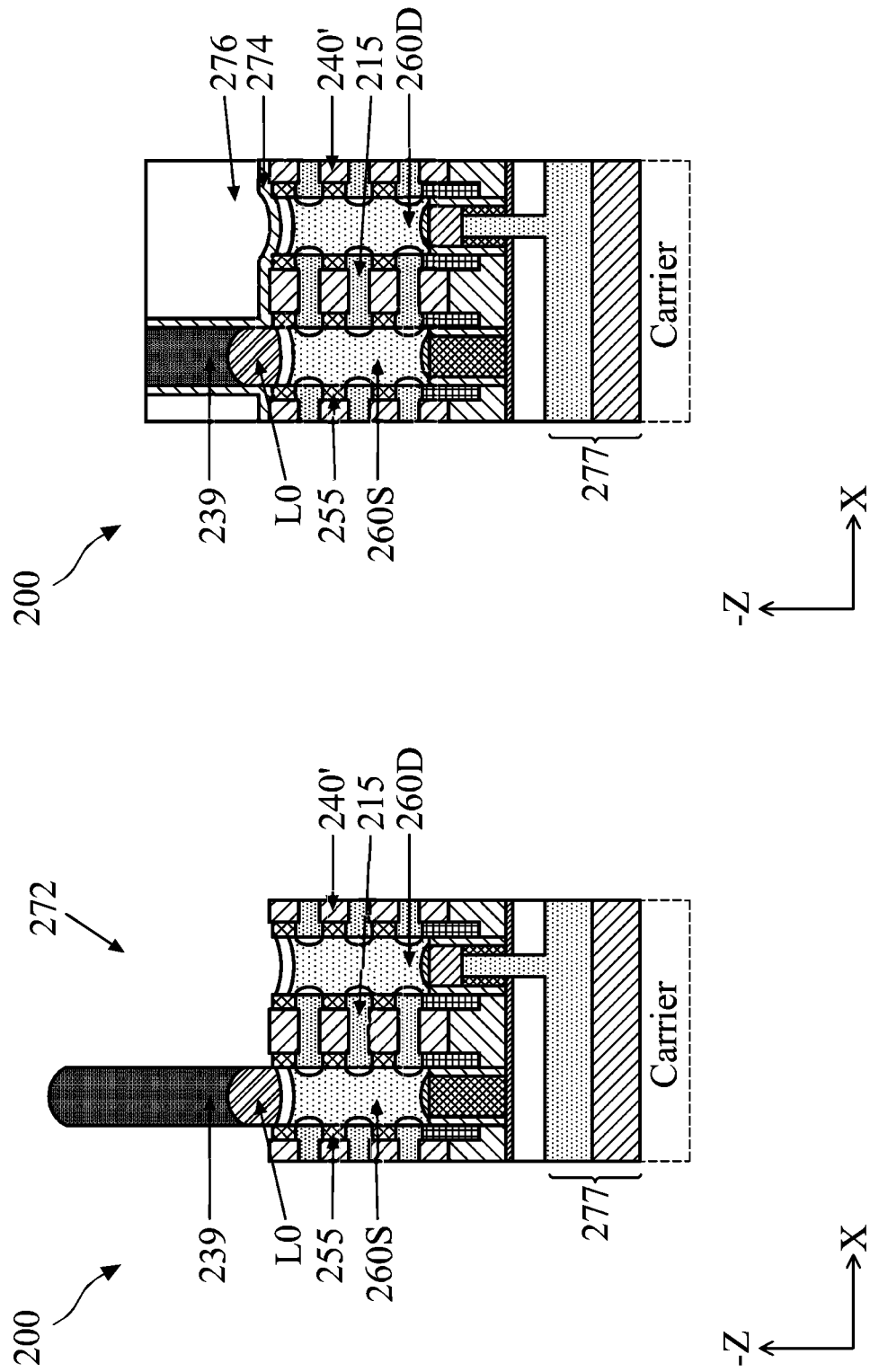

At operation 144, the method 100 (FIG. 1D) selectively removes the substrate 201 to form trenches 272, such as shown in FIG. 23. The semiconductor layer 239, the isolation structure 230 (not shown in FIG. 23), the drain feature 260D, the source feature 260S, the gate structure 240', and the inner spacers 255 may be exposed in the trenches 272. This may involve multiple processes, including a thinning process and an etching process. For example, the operation 144 may first thin down the device 200 from its backside until the semiconductor layer 239 is exposed and then selectively etch the substrate 201. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201. The etching process is tuned to be selective to the materials of the substrate 201 (such as Si in an embodiment) and with no (or minimal) etching to the gate stacks 240', the isolation features 230, and the semiconductor layer 239 (such as SiGe in an embodiment). The layer L0 of the drain feature 260D is also removed in the depicted embodiment. The layer L0 of the source feature 260S is protected by the semiconductor layer 239 from the etching process. The etching process can be dry etching, wet etching, reactive ion etching, or other etching methods.

At operation 146, the method 100 (FIG. 1D) forms a dielectric liner 274 and one or more dielectric layers 276 to fill the trenches 272. The resultant structure is shown in FIG. 24 according to an embodiment. In an embodiment, the dielectric liner 274 includes silicon nitride and the dielectric layer(s) 276 includes silicon oxide. In some embodiments, the dielectric liner 274 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric liner 274 may have a substantially uniform thickness along the various surfaces of the trenches 272, and may be formed by CVD, PVD, ALD, or other suitable methods. In some embodiments, the dielectric layer(s) 276 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer(s) 276 may be formed by PECVD (plasma enhanced CVD), FCVD (flowable CVD), or other suitable methods. The operation 146 may further perform a CMP process to planarize the backside of the device 200 and to expose the semiconductor layer 239 for further processing.

Figures 25, 26:
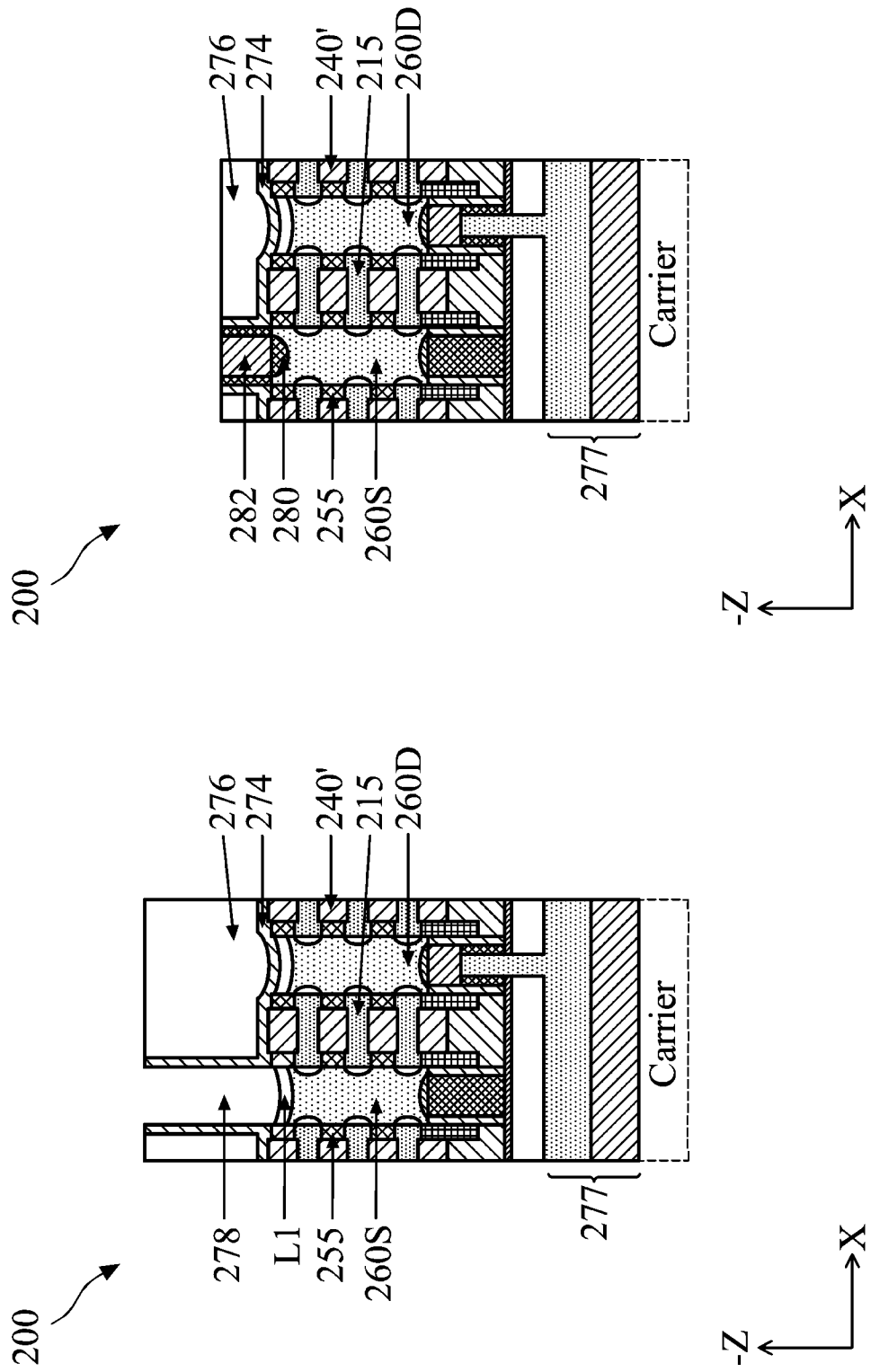

At operation 148, the method 100 (FIG. 1D) removes the semiconductor layer 239 from the backside of the device 200. In some embodiment, operation 148 also removes the layer L0 of the source feature 260S, such as shown in FIG. 25. In an embodiment, the operation 148 applies an etching process that is tuned to be selective to the materials of the semiconductor layer 239 (such as SiGe in an embodiment) and the layer L0 (such as SiGe in an embodiment) of the source feature 260S and with no (or minimal) etching to the dielectric liner 274, the dielectric layer(s) 276, the isolation features 230 (not shown in FIG. 25), and the layer L1 of the source feature 260S. The etching process results in a trench 278 that exposes the source feature 260S (particularly the layer L1 in this embodiment) from the backside of the device 200. The layer L1 may be partially etched in some embodiments. The etching process can be dry etching, wet etching, reactive ion etching, or other etching methods. In the present embodiment, the etching of the semiconductor layer 239 and the layer L0 is self-aligned. In other words, the operation 148 does not need to make an etch mask (e.g., an etch mask formed by photolithography processes) in order to etch the semiconductor layer 239 and the layer L0. Rather, it relies on the etch selectivity of the materials in the semiconductor layer 239 and the layer L0 and their surrounding layers. This beneficially forms the trenches 278 to be aligned with the underlying source feature 260S without misalignments such as those introduced by photolithography overlay shift. Using this process will result in a backside source contact (or source via) that is ideally aligned with the source feature 260S, as will be discussed below.

At operation 150, the method 100 (FIG. 1D) forms a backside source silicide feature 280 and a backside source contact (or via) 282 that are electrically connected to the source feature 260S. The resultant structure is shown in FIG. 26 according to an embodiment. As illustrated in FIG. 26, the backside source contact 282 is self-aligned to the source feature 260S as a result of the self-aligned etching processes discussed above with reference to FIG. 25. The self-aligned backside contact 282 minimizes the risks of shorting circuits between the source feature 260S and the nearby gate stacks 240'. In an embodiment, the operation 150 includes depositing one or more metals into the hole 278, performing an annealing process to the device 200 to cause reaction between the one or more metals and the source feature 260S to produce the silicide feature 280, and removing un-reacted portions of the one or more metals, leaving the silicide features 280 in the hole 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the source contact 282 may include a conductive barrier layer and a metal fill layer over the conductive barrier layer. The conductive barrier layer functions to prevent metal materials of the metal fill layer from diffusing into the dielectric layers adjacent the source contacts 282, such as the dielectric layer 274. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes. In some embodiments, the conductive barrier layer is omitted in the source contact 282. The operation 150 may perform a CMP process to remove excessive materials of the source contact 282.

Figure 27:
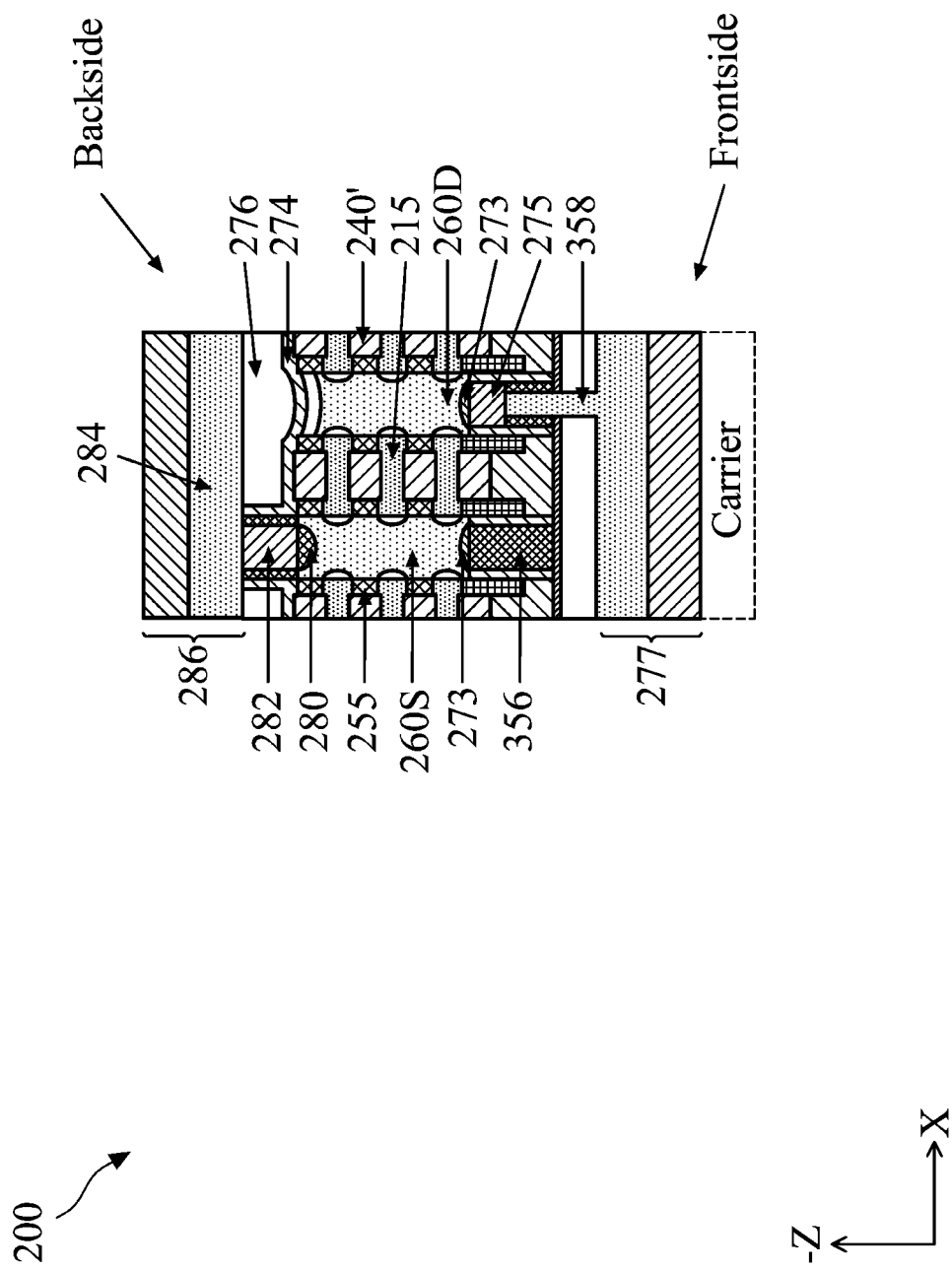

At operation 152, the method 100 (FIG. 1D) forms a backside power rail 284 and a backside interconnect 286. The resultant structure is shown in FIG. 27 according to an embodiment. The backside source contact 282 is electrically connected to the backside power rail 284. In an embodiment, the backside power rail 284 may be formed using a damascene process, a dual-damascene process, a metal patterning process, or other suitable processes. The backside power rail 284 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 27, the backside power rail 284 is embedded in one or more dielectric layers, and the backside interconnect 286 includes wires and vias embedded in one or more dielectric layers. In some embodiment, the backside power rail 284 is considered part of the backside interconnect 286. Having backside power rail 284 beneficially increases the number of metal tracks available in the device 200 for directly connecting to source/drain contacts and vias. It also increases the gate density for greater device integration than other structures without the backside power rail 284. The backside power rail 284 may have wider dimension than the first level metal (M0) tracks on the frontside of the device 200, which beneficially reduces the backside power rail resistance.

At operation 154, the method 100 (FIG. 1D) performs further fabrication processes to the device 200. For example, it may form passivation layers on the backside of the device 200, remove the carrier 370, and perform other BEOL processes.

In the above embodiments, the source feature 260S is formed with a backside silicide feature and a backside contact and is isolated from frontside power rails and frontside interconnects, while the drain feature 260D is formed with a frontside silicide feature and a frontside contact and is isolated from backside power rails and backside interconnects. In an alternative embodiment, the drain feature 260D is formed with a backside silicide feature and a backside contact and is isolated from frontside power rails and frontside interconnects, while the source feature 260S is formed with a frontside silicide feature and a frontside contact and is isolated from backside power rails and backside interconnects. This may be achieved by switching the processes that are specifically applied to the source region with those that are specifically applied to the drain region in the above embodiment. For example, the semiconductor layer 239 may be provided in the drain region, but not in the source region.

FIG. 28 illustrates a cross-sectional view of a portion of the semiconductor device 200 fabricated according to an alternative embodiment of the method 100. Referring to FIG. 28, in this embodiment, the operation 134 completely removes not only the source contact 275 but also the source silicide 273. The dielectric cap 356 is deposited directly on the source feature 260S. The bottom surface 356a of the dielectric cap 356 is below the top surface 240a of the gate structure 240'.

Figure 29:
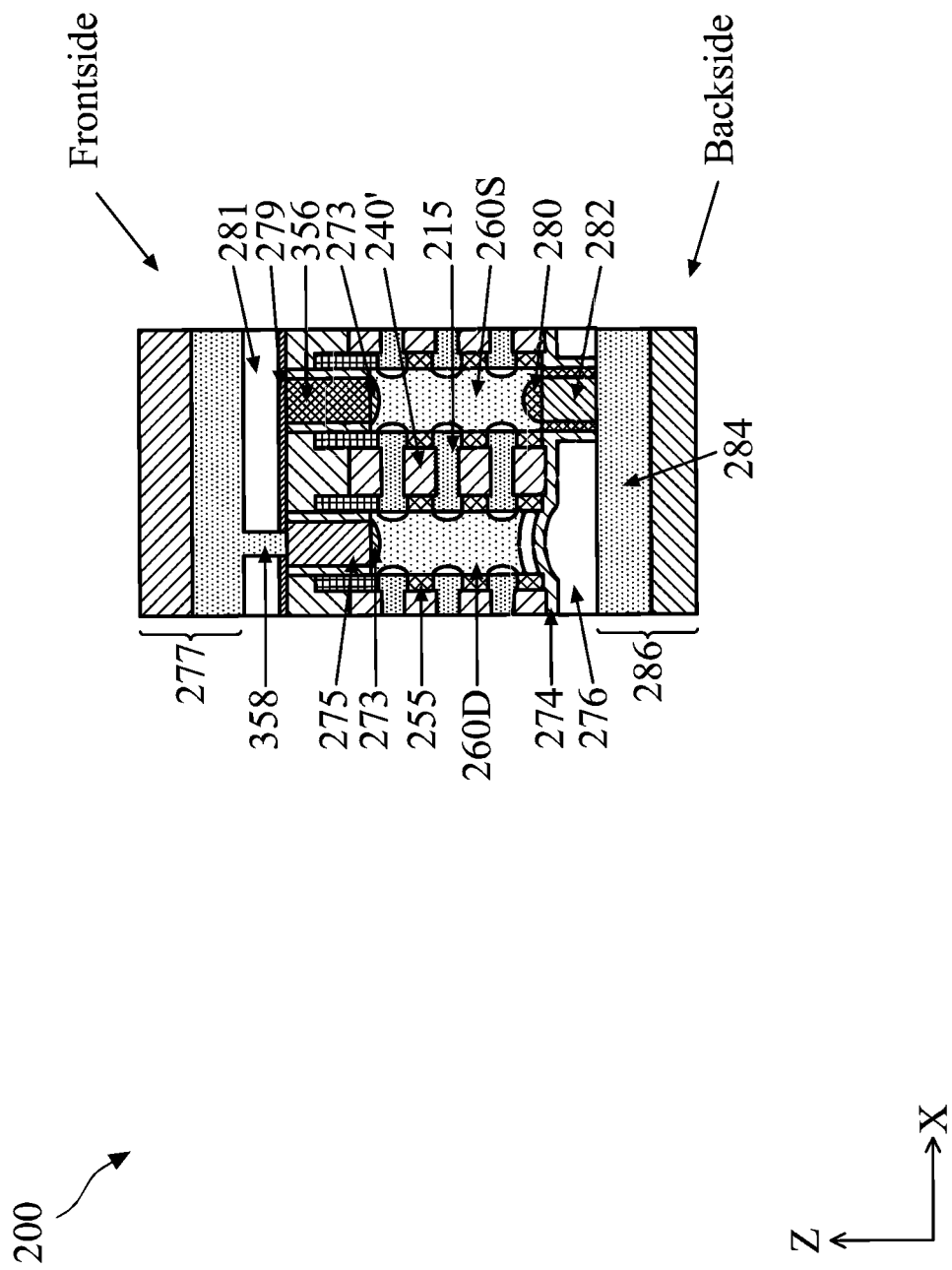

FIG. 29 illustrates a cross-sectional view of a portion of the semiconductor device 200 fabricated according to an alternative embodiment of the method 100 where the operation 132 is omitted. Referring to FIG. 29, in this embodiment, the drain contact 275 is not recessed and the dielectric cap 356 is disposed above the source feature 260S, but not above the drain feature 260D. The source silicide feature 273 is partially or completely preserved in this embodiment. In an alternative embodiment, the source silicide feature 273 is partially or completely removed.

Figure 30:
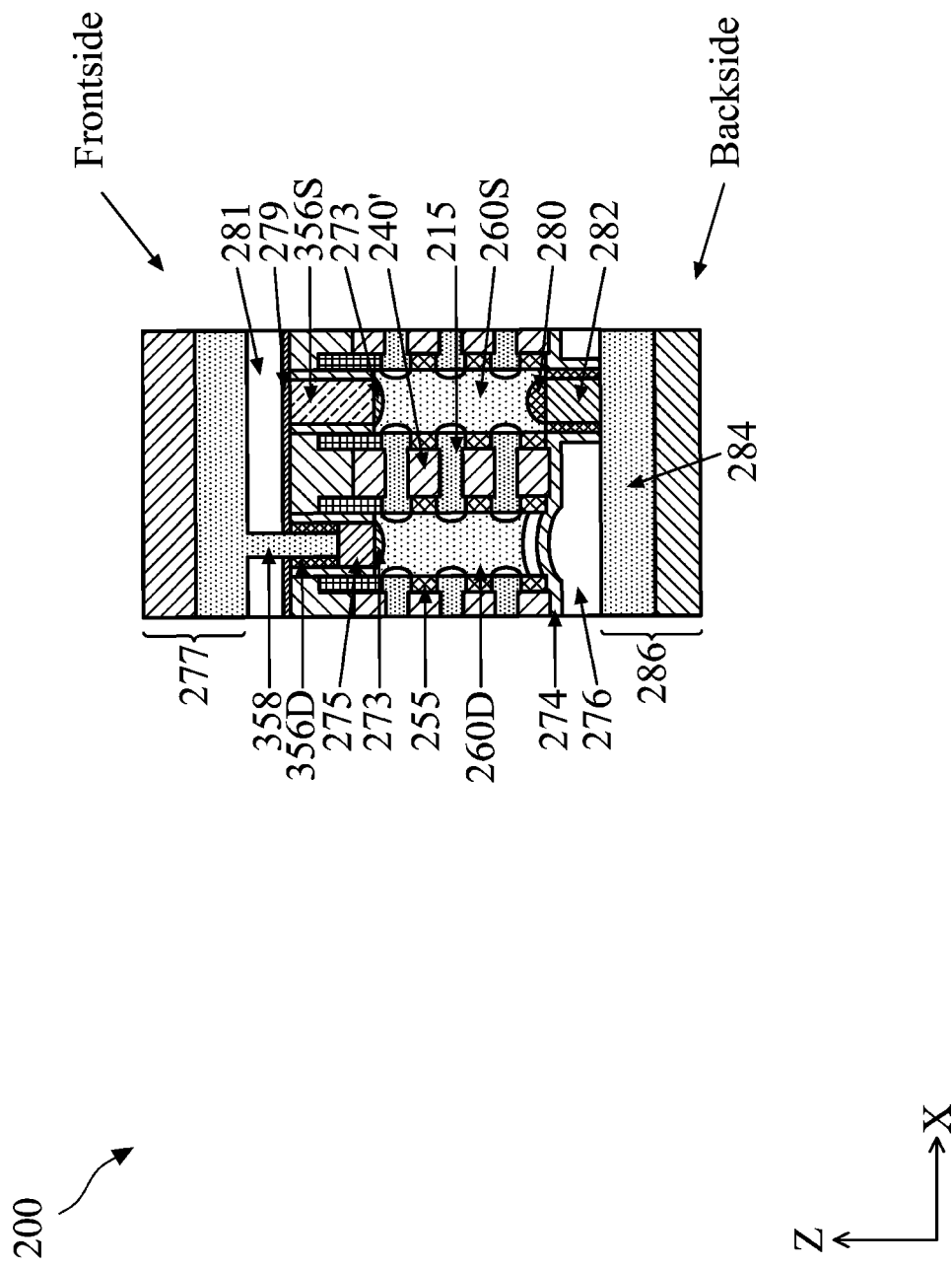

FIG. 30 illustrates a cross-sectional view of a portion of the semiconductor device 200 fabricated according to an alternative embodiment of the method 100 where the dielectric cap 356 above the drain feature 260D (labeled as 356D) and the dielectric cap 356 above the source feature 260S (labeled as 356S) include different dielectric materials. In an embodiment, this is achieved by depositing the dielectric cap 356S after the hole 253b is formed and before the etch mask 241a is removed (FIG. 18) and then depositing the dielectric cap 356D after the etch mask 241a is removed from the hole 253a. In another embodiment, this is achieved by removing the dielectric cap 356 from the source side after the operation 136 finishes, for example, using photolithograph and etching processes and then depositing the dielectric cap 356S. In an embodiment, the dielectric cap 356S includes a low-k dielectric material (e.g., k less than about 3.9) to further reduce the coupling capacitance between the source feature 260S and nearby conductive features. For example, the dielectric cap 356S may include SiOCN, SiOC, SiCN, or other low-k dielectric material.

Although not intended to be limiting, embodiments of the present disclosure provide one or more of the following advantages. For example, embodiments of the present disclosure provide methods for forming semiconductor devices with both frontside power rails and interconnect and backside power rails and interconnect. This increases the number of metal tracks available in the semiconductor devices for directly connecting to source/drain contacts and vias. It also increases the gate density for greater device integration. Embodiments of the present disclosure also provide methods for forming source and/or drain features with contacts on one side only (either frontside or backside), thereby reducing the coupling capacitance between source/drain features and nearby conductors such as metal gates, source/drain vias, and gate vias. Embodiments of the present disclosure can be readily integrated into existing semiconductor manufacturing processes.

In one example aspect, the present disclosure is directed to a semiconductor structure. The semiconductor structure includes one or more channel layers; a gate structure engaging the one or more channel layers; a first source/drain feature connected to a first side of the one or more channel layers and adjacent to the gate structure; a first dielectric cap disposed over the first source/drain feature, wherein a bottom surface of the first dielectric cap is below a top surface of the gate structure; a via disposed under and electrically connected to the first source/drain feature; and a power rail disposed under and electrically connected to the via.

In an embodiment, the semiconductor structure further includes a silicide feature disposed between the first dielectric cap and the first source/drain feature.

In another embodiment, the semiconductor structure further includes a second source/drain feature connected to a second side of the one or more channel layers that is opposite to the first side of the one or more channel layers, wherein the gate structure is disposed between the first and the second source/drain features; a contact plug disposed over and electrically connected to the second source/drain feature; and a dielectric feature disposed under the second source/drain feature and isolating the second source/drain feature from the power rail. In an embodiment, the semiconductor structure further includes a second dielectric cap disposed over the contact plug and a second via penetrating the second dielectric cap and electrically connected to the contact plug. In some embodiments, the first dielectric cap and the second dielectric cap include a same material. In some embodiments, the first dielectric cap and the second dielectric cap include different materials. In some embodiments, the first dielectric cap includes a material having a lower dielectric constant than that of a material in the second dielectric cap. In some embodiments, the first dielectric cap is thicker than the second dielectric cap.

In another embodiment, the semiconductor structure further includes a first interconnect structure over the first dielectric cap, wherein the first dielectric cap isolates the first source/drain feature from the first interconnect structure.

In another example aspect, the present disclosure is directed to a method that includes providing a structure having a substrate, a source feature and a drain feature over the substrate, one or more channel layers connecting the source and the drain features, a gate structure between the source and the drain features and engaging the one or more channel layers, and one or more dielectric layers disposed over the source and the drain features. The method further includes forming a source contact hole and a drain contact hole that penetrate through the one or more dielectric layers and expose the source feature and the drain feature respectively; forming a source contact and a drain contact in the source contact hole and the drain contact hole respectively; forming an etch mask that covers the drain contact and exposes the source contact; removing the source contact through the etch mask, thereby reclaiming at least a portion of the source contact hole; and depositing a first dielectric cap in at least the portion of the source contact hole.

In an embodiment, the method further includes forming a source silicide feature between the source feature and the source contact and a drain silicide feature between the drain feature and the drain contact. In a further embodiment, the removing of the source contact also removes at least a portion of the source silicide feature.

In an embodiment, the method further includes partially recessing the drain contact before the forming of the etch mask, thereby reclaiming a portion of the drain contact hole; and depositing a second dielectric cap in the portion of the drain contact hole.

In another embodiment, the method further includes forming a first interconnect structure over the first dielectric cap and forming a via under the source feature and electrically connected to the source feature. In a further embodiment, the method further includes forming a power rail under the via and electrically connected to the via.

In yet another example aspect, the present disclosure is directed to a method that includes providing a structure having a substrate, first and second source/drain features over the substrate, one or more channel layers connecting the first and the second source/drain features, a high-k metal gate between the first and the second source/drain features and engaging the one or more channel layers, and one or more dielectric layers disposed over the first and the second source/drain features. The method further includes forming first and second contacts that go through the one or more dielectric layers and electrically connected to the first and the second source/drain features respectively; forming an etch mask that exposes the first contact and covers the second contact; removing the first contact through the etch mask, resulting in a first trench over the first source/drain feature; depositing a first dielectric cap in the first trench; forming a first via over the second contact and electrically connected to the second contact; and forming a first interconnect structure over the first via and electrically connected to the first via, wherein the first dielectric cap isolates the first source/drain feature from the first interconnect structure. The method further includes forming a second via under the first source/drain feature and electrically connected to the first source/drain feature and forming a second interconnect structure under the second via and electrically connected to the second via.

In an embodiment, before the forming of the first and the second contacts, the method further includes forming a first silicide feature between the first contact and the first source/ drain feature and a second silicide feature between the second contact and the second source/drain feature. In a further embodiment, the removing of the first contact also removes at least a portion of the first silicide feature.

In an embodiment, before the forming of the etch mask, the method further includes partially recessing the second contact, resulting in a second trench over the second contact and forming a second dielectric cap in the second trench, wherein the first via penetrates the second dielectric cap. In a further embodiment, the first and the second dielectric caps include different materials.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a structure having a substrate, a source feature and a drain feature over the substrate, one or more channel layers connecting the source and the drain features, a gate structure between the source and the drain features and engaging the one or more channel layers, and one or more dielectric layers disposed over the source and the drain features;
   forming a source contact hole and a drain contact hole that penetrate through the one or more dielectric layers and expose the source feature and the drain feature respectively;
   forming a source contact and a drain contact in the source contact hole and the drain contact hole respectively;
   forming an etch mask that covers the drain contact and exposes the source contact;
   removing the source contact through the etch mask, thereby reclaiming at least a portion of the source contact hole; and
   depositing a first dielectric cap in at least the portion of the source contact hole.

2. The method of claim 1, further comprising:
   forming a source silicide feature between the source feature and the source contact and a drain silicide feature between the drain feature and the drain contact.

3. The method of claim 2, wherein the removing of the source contact also removes at least a portion of the source silicide feature.

4. The method of claim 1, further comprising:
   before the forming of the etch mask, partially recessing the drain contact, thereby reclaiming a portion of the drain contact hole; and
   depositing a second dielectric cap in the portion of the drain contact hole.

5. The method of claim 1, further comprising:
   forming a first interconnect structure over the first dielectric cap; and
   forming a via under the source feature and electrically connected to the source feature.

6. The method of claim 5, further comprising:
   forming a power rail under the via and electrically connected to the via.

7. A method comprising:
   providing a structure having a substrate, first and second source/drain features over the substrate, one or more channel layers connecting the first and the second source/drain features, a high-k metal gate between the first and the second source/drain features and engaging the one or more channel layers, and one or more dielectric layers disposed over the first and the second source/drain features;
   forming first and second contacts that go through the one or more dielectric layers and electrically connected to the first and the second source/drain features respectively;
   forming an etch mask that exposes the first contact and covers the second contact;
   removing the first contact through the etch mask, resulting in a first trench over the first source/drain feature;
   depositing a first dielectric cap in the first trench;
   forming a first via over the second contact and electrically connected to the second contact; and
   forming a first interconnect structure over the first via and electrically connected to the first via, wherein the first dielectric cap isolates the first source/drain feature from the first interconnect structure.

8. The method of claim 7, before the forming of the first and the second contacts, further comprising:
   forming a first silicide feature between the first contact and the first source/drain feature and a second silicide feature between the second contact and the second source/drain feature.

9. The method of claim 8, wherein the removing of the first contact also removes at least a portion of the first silicide feature.

10. The method of claim 7, before the forming of the etch mask, further comprising:
    partially recessing the second contact, resulting in a second trench over the second contact; and
    forming a second dielectric cap in the second trench, wherein the first via penetrates through the second dielectric cap.

11. The method of claim 10, wherein the first and the second dielectric caps include different materials.

12. The method of claim 7, further comprising:
    forming a second via under the first source/drain feature and electrically connected to the first source/drain feature.

13. The method of claim 12, further comprising:
    forming a second interconnect structure under the second via and electrically connected to the second via.

14. A method comprising:
    providing a structure having a substrate, a source region and a drain region over the substrate, one or more channel layers connecting the source region and the drain region, a gate structure engaging the one or more channel layers, and one or more dielectric layers disposed over the source and the drain regions;
    forming a source contact and a drain contact that penetrate through the one or more dielectric layers and connect to the source region and the drain region, respectively;
    forming an etch mask that exposes a first one of the source and the drain contacts and covers a second one of the source and the drain contacts;
    removing the first one of the source and the drain contacts through the etch mask, thereby forming a first hole in the one or more dielectric layers; and
    depositing a first dielectric cap in the first hole.

15. The method of claim 14, before the forming of the etch mask, further comprising:
- partially recessing the second one of the source and the drain contacts, resulting in a second hole in the one or more dielectric layers; and
- forming a second dielectric cap in the second hole.

16. The method of claim 15, wherein the first dielectric cap and the second dielectric cap include different materials.

17. The method of claim 15, further comprising:
- forming a via that penetrates through the second dielectric cap and electrically connects to the second one of the source and the drain contacts.

18. The method of claim 17, further comprising:
- forming an interconnect structure over the via and electrically connected to the via.

19. The method of claim 14, further comprising:
- forming a via under the source and the drain regions, wherein one of the source and the drain regions is disposed vertically between the via and the first dielectric cap, and the one of the source and the drain regions is electrically connected to the via.

20. The method of claim 19, further comprising:
- forming an interconnect structure under the via and electrically connected to the via.

* * * * *